United States Patent [19]
Kozuka et al.

[11] Patent Number: 5,481,124
[45] Date of Patent: Jan. 2, 1996

[54] LAMINATED SOLID-STATE IMAGE PICKUP DEVICE

[75] Inventors: Hiraku Kozuka, Hiratsuka; Shigetoshi Sugawa; Hisae Shimizu, both of Atsugi, all of Japan

[73] Assignee: Canon Kabushiki Kaisha, Tokyo, Japan

[21] Appl. No.: 288,546

[22] Filed: Aug. 10, 1994

[30] Foreign Application Priority Data

Aug. 24, 1993 [JP] Japan ................................. 5-229605
Jul. 26, 1994 [JP] Japan ................................. 6-174292

[51] Int. Cl.$^6$ .......................... H01L 27/14; H01L 31/00
[52] U.S. Cl. ................ 257/185; 257/16; 257/21; 257/22; 257/72; 257/186; 257/191; 257/232; 257/233; 257/292; 257/438; 257/444; 257/446; 257/448; 257/577
[58] Field of Search ................... 257/16, 17, 21, 257/22, 55, 72, 185, 186, 191, 232, 233, 291, 292, 438, 444, 446, 448, 577

[56] References Cited

U.S. PATENT DOCUMENTS

| | | | |
|---|---|---|---|
| 5,187,553 | 2/1993 | Makita | 257/187 |
| 5,204,539 | 4/1993 | Tsuji et al. | 257/21 |
| 5,260,560 | 11/1993 | Yamanobe et al. | 250/214 |
| 5,281,844 | 1/1994 | Funaba | 257/438 |
| 5,324,959 | 6/1994 | Nakamura et al. | 257/17 |
| 5,338,947 | 8/1994 | Watanabe | 257/186 |
| 5,401,952 | 3/1995 | Sugawa | 250/208.1 |

FOREIGN PATENT DOCUMENTS

| | | |
|---|---|---|
| 0437633 | 7/1991 | European Pat. Off. . |
| 0542152 | 5/1993 | European Pat. Off. . |
| 49-91116 | 8/1974 | Japan . |
| 51-10715 | 1/1976 | Japan . |
| 63-66965 | 3/1988 | Japan . |
| 4-030577 | 2/1992 | Japan . |

Primary Examiner—Ngân V. Ngô
Attorney, Agent, or Firm—Fitzpatrick, Cella, Harper & Scinto

[57] ABSTRACT

Compatibility of high sensitivity with low remaining images, and low crosstalk can be achieved by a laminated solid-state image pickup device, which includes accumulating portions for accumulating electric signals, reading units for reading the electric signals, connecting members formed in contact with the accumulating portions, and a photoconductive film, and by a method for manufacturing the device. The photoconductive film is made of a non-crystalline semiconductor, and is configured by laminating a carrier multiplication layer, a light absorbing layer, a charge injection inhibiting layer of a second conduction type. Each of the connecting members is made of a semiconductor layer of a first conduction type, intrinsic or having a low impurity density, surrounded by a semiconductor layer of the second conduction type or a conductive material.

40 Claims, 13 Drawing Sheets

LAMINATED SOLID-STATE IMAGE PICKUP DEVICE

BACKGROUND OF THE INVENTION

1. Field of the Invention

This invention relates to a laminated solid-state image pickup device, and a method for manufacturing the device, and more particularly, to a laminated solid-state image pickup device having a photoconductive film on a substrate, and a method for manufacturing the device.

2. Description of the Related Art

Recently, solid-state image pickup devices utilizing semiconductors have been increasingly used. In accordance with this tendency, solid-state image pickup devices with higher performance and lower prices have been requested.

For example, CCD's (charge-coupled devices) and MOS (metal oxide semiconductor) solid-state image pickup devices are known as solid-state image pickup devices. In many of such solid-state image pickup devices, a photosensing unit, a signal charge storage unit, and peripheral circuits, such as a signal reading circuit, a main scanning circuit, a signal processing circuit and the like, are formed in the same semiconductor substrate.

In such solid-state image pickup devices, considerably excellent characteristics are obtained in the performance of residual images, and crosstalk between pixels. However, as the device has higher definition, the photosensing area for each pixel is reduced. That is, the photosensing area per unit area, i.e., the effective numerical aperture, is reduced. As a result, the problem that it is difficult to obtain a sufficient sensitivity, in some cases, arises.

In order to provide higher sensitivity, there have been proposals of substantially increasing the numerical aperture by forming a photoconductive film on a semiconductor substrate, in which the above-described (semiconductor) circuits are formed, as a photosensing device (for example, Japanese Patent Laid-open Application (Kokai) Nos. 49-91116 (1974) and 51-10715 (1976)). A solid-state image pickup device having such a configuration is termed a laminated solid-state image pickup device.

FIG. 1 is a schematic cross-sectional view of a laminated solid-state image pickup device.

In FIG. 1, there are shown a p-type silicon substrate 1, a vertical CCD 2, an n-type cathode layer 3, trasfer gate electrodes 4, interlayer insulating films 5, a first pixel electrode 6, a second pixel electrode 7, a photoconductive film 8, and a transparent conductive film 9.

In the case of FIG. 1, a interline-transfer-type CCD image pickup device is formed on the p-type silicon substrate 1. The n-type cathode layer 3 constitutes an accumulating diode for accumulating signal charges. The vertical CCD 2, comprising an n-type buried-channel CCD, is formed close to the n-type cathode layer 3 of the accumulating diode. The first pixel electrode 6 is connected to the n-type cathode layer 3 of the accumulating diode, and the second pixel electrode 7 is connected to the first pixel electrode 6.

The transparent conductive film 9 is formed on the second pixel electrode 7 via the photoconductive film 8. The photoconductive film 8 sandwiched between the transparent conductive film 9 and the second pixel electrode 7 functions as a photoelectric conversion unit. The transfer gate electrodes 4 are made of polysilicon or the like, and transfer electric charges from the accumulating diode to the CCD channel. In order to prevent unnecessary short circuit between the electrodes and the like, interlayer insulating films 5 are provided.

As shown in FIG. 1, in a typical laminated solid-state image pickup device, the n-type cathode layer (an accumulating portion) 3, formed in the substrate 1, and the photoconductive layer 8 are connected by the pixel electrodes 6 and 7.

In the laminated solid-state image pickup device having the configuration shown in FIG. 1, the numerical aperture can be substantially 100%. Hence, the device of this configuration is advantageous over a non-laminated solid-state image pickup device from the viewpoint of an increase in the sensitivity. However, in order to realize an untrahigh-definition solid-state image pickup device having more than two-million pixels, the sensitivity must be further increased.

Furthermore, the problems that crosstalk between pixels increases because the distance between adjacent pixel electrodes is reduced, and that capacitive residual images caused by the capacitance of the photoconductive film are produced, may arise. Such problems are obstacles for providing the performance required for obtaining an image having higher picture quality.

Laminated solid-state image pickup devices which solve the above-described problems have been proposed.

For example, in order to reduce crosstalk between pixels, a proposal of providing a control electrode for preventing crosstalk between pixel electrodes is described in Japanese Patent Laid-open Application (Kokai) No. 4-30577 (1992).

In order to reduce capacitive residual images, a proposal of configuring a connecting conductor for connecting pixel electrodes to a first-conduction-type layer (for example, an n-type-semiconductor layer) of a signal charge storage diode by a first-conduction-type semiconductor, and providing a second-conduction-type layer from a side of the connecting conductor to a second-conduction-type channel stopper layer (for example, a p-type-semiconductor layer) via the surface of a first-conduction-type impurity layer of the accumulating diode is described in Japanese Patent Laid-open Application (Kokai) No. 63-66965 (1988).

A high-sensitivity and high-response-speed photoelectric transducer including a photoconductive region having a carrier multiplication function is described in European Patent Laid-open Application No. EP437633.

A laminated solid-state image pickup device, in which a photoconductive region having a carrier multiplication function is connected to an accumulating capacitive portion using a semiconductive or metallic connecting member, is described in European Patent Laid-open Application No. EP542152.

However, the above-described solid-state iamge pickup devices still have room for improvement with respect to reduction in residual-image characteristics and crosstalk between pixels.

In order to improve residial-image characteristics, it is effective to reduce capacitive residual images. In order to reduce capacitive residual images, it is desirable to completely deplete a region between the photoconductive film and the accumulating capacitive portion.

However, in the laminated solid-state image pickup devices described in Japanese Patent Laid-open Application (Kokai) No. 4-30577 (1992), and European Patent Laid-open Application Nos. EP437633 and EP542152, a photoconductive layer is electrically connected to an accumulating capacitive portion via a metallic electrode or a semiconductive layer including a high-density impurity, and there is no idea of providing a completely depleted region. Hence, there is room for solving the problem of capacitive residual images.

The laminated solid-state image pickup device described in Japanese Patent Laid-open Application (Kokai) No. 63-66965 (1988) has a schematic cross-sectional view shown in FIG. 2.

In FIG. 2, components having the same reference numerals as in FIG. 1 are the same components as those shown in FIG. 1. In FIG. 2, there are shown a p-type a-Si (amorphous silicon) layer 10, an n-type single-crystal Si whisker (a connecting member) 11, an n-type a-Si electrode (a pixel electrode) 12, an undoped a-Si layer (a photoconductive film) 13, a p-type a-SiC film 14, and a p$^+$-type channel-stopper layer 15.

As described above, a connecting conductor for connecting the n-type a-Si electrode 12 to the n-type cathode layer 3, serving as the first-conduction-type layer of the signal charge accumulating diode, is formed by the n-type single-crystal Si whisker 11, and the p-type a-Si layer 10 is provided at the circumferential side of the n-type single-crystal Si whisker 11. The p-type a-Si layer 10 is connected to the p$^+$-type channel stopper layer 15.

In the photoelectric transducer shown in FIG. 2, in order to substantially increase the numerical aperture, the n-type a-Si electrode 12 is used as the pixel electrode. The area of the n-type a-Si electrode 12 is greater than the area of the connecting portion of the connecting conductor connected to the accumulating diode. Accordingly, when the distribution of the elctric field obtained when a bias voltage is applied to the transparent conductive layer on the photoconductive layer is considered, it is very difficult to deplete the photoconductive film over the entire area of the pixel electrode, and to transport photocarriers, which have reached the pixel electrode, in the lateral direction of the pixel electrode to the accumulating capacitive portion of the accumulating diode. Hence, although residual images can be reduced, there is still room for improvement.

In the device described in Japanese Patent Laid-open Application (Kokai) No. 63-66965 (1988), the single-crystal Si whisker connecting conductor is formed after forming a CCD, using a vapor/liquid/solid-phase growth method (VLS method). In this production method, restrictions are present for the process temperature for circuitry in the substrate, and a high-temperature process for forming a connecting conductor having a low defect density cannot be used. Accordingly, in the production method described in Japanese Patent Laid-open Application (Kokai) No. 63-66965 (1988), it is difficult to sufficiently reduce defects in the connecting conductor, and there is room for improvement in residual-image characteristics.

In the laminated solid-state image pickup devices shown in FIGS. 1 and 2 and described in the foregoing patent applications, as the number of pixels per unit area increases, i.e., as the density of pixels increases, the distance between adjacent pixels is reduced, thereby causing, in some cases, the problem of crosstalk between adjacent pixels.

Also in laminated solid-state image pickup devices in which the area of the pixel electrode is substantially the same as the area of the accumulating capacitive portion of the circuitry in the substrate, sufficient characteristics cannot, in some cases, be obtained due to leakage between pixels via defects present in the interface between the photoconductive film and the insulating film.

As described above, it is difficult to simultaneously reduce capacitive residual images and crosstalk between pixels in laminated solid-state image pickup devices, and there is still room for improvement in laminated solid-state image pickup devices.

SUMMARY OF THE INVENTION

The present invention has been made in consideration of the above-described problems.

It is an object of the present invention to provide a laminated solid-state image pickup device in which residual images and crosstalk between pixels are reduced, and a method for manufacturing the device.

It is another object of the present invention to provide a laminated solid-state image pickup device which can obtain a high-quality image with high sensitivity, and a method for manufacturing the device.

It is still another object of the present invention to provide a laminated solid-state image pickup device in which an electric field is uniformly applied from a photoconductive film to an accumulating capacitive portion, and a depleted state can be realized, and a method for manufacturing the device.

It is yet another object of the present invention to provide a laminated solid-state image pickup device in which a connecting member for transporting carriers can be manufactured with a low defect density, and a method for manufacturing the device.

According to one aspect, the present invention, which achieves these objectives, relates to a laminated solid-state image pickup device comprising a semiconductor circuit substrate, comprising accumulating portions for accumulating electric signals, and reading means for reading the electric signals, an insulating layer formed on the semiconductor circuit substrate except at at least a part of the accumulating portions, connecting members formed in contact with the accumulating portions, and a photoconductive film laminated on the insulating layer and the connecting members. The photoconductive film comprises a non-crystalline semiconductor configured by laminating a carrier multiplication layer, a light absorbing layer, a charge injection inhibiting layer of a second conduction type. Each of the connecting members comprises a first semiconductor region of a first conduction type, instrinsic or having a low impurity density, surrounded by a second semiconductor region of the second conduction type.

According to another aspect, the present invention relates to a laminated solid-state image pickup device comprising a semiconductor circuit substrate, comprising accumulating portions for accumulating electric signals, and reading means for reading the electric signals, an insulating layer formed on the semiconductor circuit substrate except at at least a part of the accumulating portions, connecting members formed in contact with the accumulating portions, and a photoconductive film laminated on the insulating layer and the connecting members. The photoconductive film comprises a non-crystalline semiconductor configured by laminating a carrier multiplication layer, a light absorbing layer, a charge injection inhibiting layer of a second conduction type. Each of the connecting members comprises a first semiconductor region of a first conduction type, instrinsic or having a low impurity density, surrounded by a conductive material.

According to still another aspect, the present invention relates to a method for manufacturing a laminated solid-state image pickup device, comprising the steps of forming a first semiconductor region of a first conduction type, instrinsic or having a low impurity density, on accumulating portions, for accumulating electric signals, in a semiconductor circuit substrate, comprising the accumulating portions and at least a part of reading means for reading the electric signals, forming a second semiconductor region of a second conduction type around the first semiconductor region, and forming a photoconductive film, comprising a carrier multiplication layer, a light absorbing layer and a charge injection inhibiting layer, on the first semiconductor region and the second semiconductor region.

According to yet another aspect, the present invention relates to a method for manufacturing a laminated solid-state image pickup device, comprising the steps of forming a first semiconductor region of a first conduction type, instrinsic or having a low impurity density, on accumulating portions, for accumulating electric signals, in a semiconductor circuit substrate, comprising the accumulating portions, for accumulating electric signals, on a semiconductor circuit substrate, comprising the accumulating portions and at least a part of reading means for reading the electric signals, forming a conductive material around the first semiconductor region, and forming a photoconductive film, comprising a carrier multiplication layer, a light absorbing layer and a charge injection inhibiting layer, on the first semiconductor region and the conductive material.

The foregoing and other objects, advantages and features of the present invention will become more apparent from the following detailed description of the preferred embodiments taken in conjunction with the accompanying drawings.

DETAILED DESCRIPTION OF THE PREFERRED EMBODIMENTS

A description will now be provided of laminated solid-state image pickup devices and methods for manufactuing the devices according to preferred embodiments of the present invention.

In the present invention, a connecting member for connecting a semiconductor substrate to a photoconductive film comprises a first semiconductor region, intrinsic or having an impurity for providing a first conduction type, surrounded by a second semiconductor region, having an impurity for providing a second conduction type, or a conductive material.

The connecting member is provided by forming the second semiconductor region or the conductive material after forming the first semiconductor region. It is desirable to fix the second semiconductor region or the conductive material of the connecting member to a desired potential.

It is not always necessary to provide the second semiconductor region or the conductive material around the first semiconductor region without being interrupted. A part of the second semiconductor region or the conductive material may be interrupted, provided that the functions and effects which will be described later are obtained.

A laminated solid-state image pickup device according to a preferred embodiment of the present invention will now be described together with the functions thereof.

Figure 3:
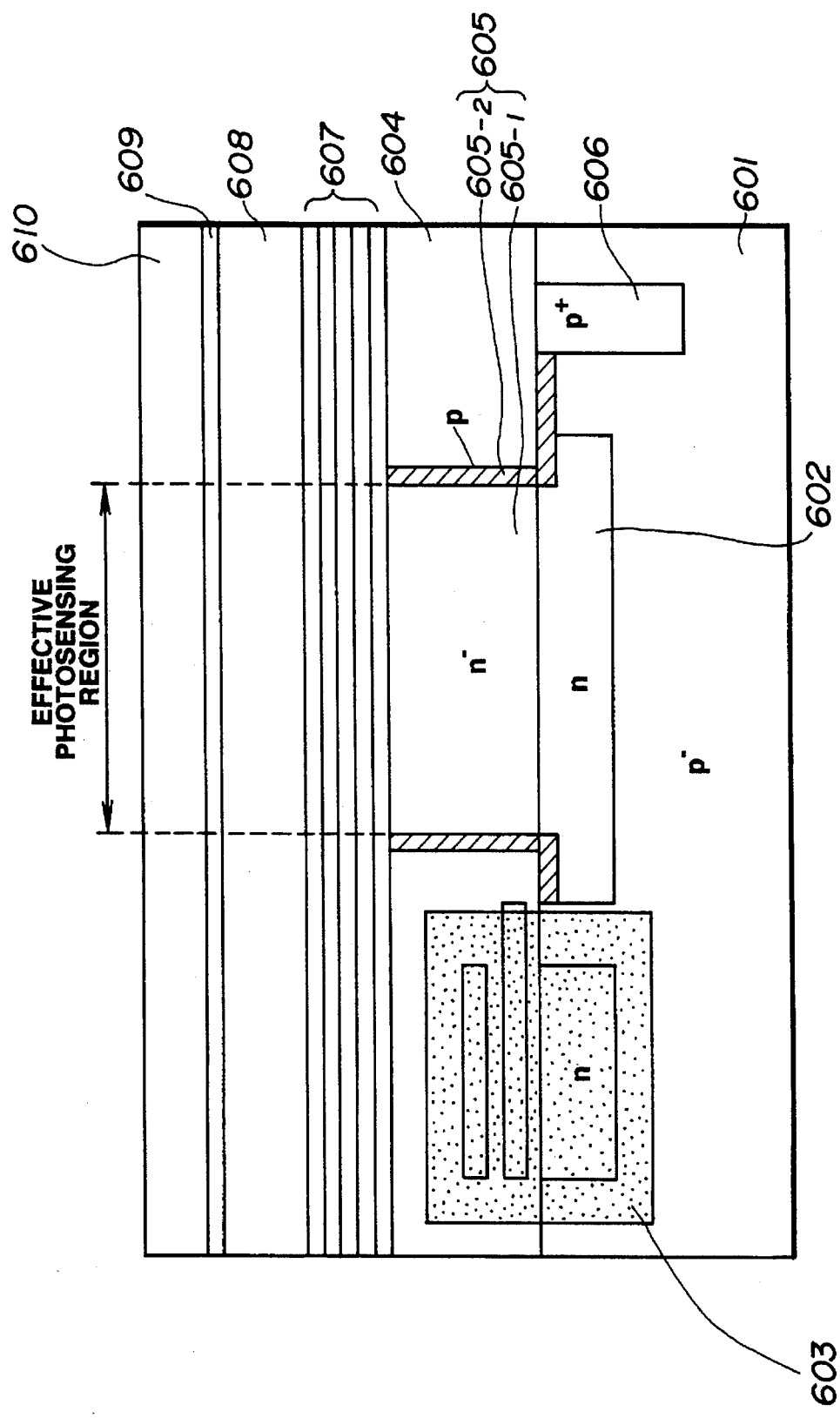
FIG. 3 is a schematic cross-sectional view illustrating the structure of a laminated solid-state image pickup device according to a preferred embodiment of the present invention.

FIG. 3 is a schematic cross-sectional view illustrating the structure of the laminated solid-state image pickup device of the embodiment.

In FIG. 3, there are shown a semiconductor substrate 601, a signal charge accumulating portion (accumulating capacitance) 602, and a circuit formation region portion, comprising a signal reading circuit and the like. Although a CCD is illustrated in FIG. 3, an MOS transistor, an SIT (static induction transistor), a bipolar transistor, or the like may be used. There are also shown an insulating film 604, and a connecting member 605. A photoconductive layer 600 comprises a multiplication layer 607, a light absorbing layer 608 and a charge injection inhibiting layer 609 laminated in this sequence.

That is, FIG. 3 illustrates the laminated solid-state image pickup device obtained by laminating the photoconductive layer, having the multiplication layer, on the semiconductor circuit substrate.

One end of the connecting member 605 is connected to the signal charge accumulating portion 602, and the other end is connected to the multiplication layer 607. The connecting member 605 comprises a carrier transport layer (a first semiconductor region) 605-1, comprising a semiconductor region that includes a very small amount of impurity capable of controlling the conduction type of the semiconductor to intrinsic or a first conduction type, or that includes an impurity capable of controlling the conduction type of the semiconductor to the first conduction type more than an impurity capable of controlling the conduction type of the semiconductor to a second conduction type (which is a conduction type inverse to the first conduction type), and a barrier layer 605-2, comprising a second semiconductor region that includes an impurity capable of controlling the conduction type of the semiconductor to the second conduction type, or that includes an impurity capable of controlling the conduction type of the semiconductor to the second conduction type more than an impurity capable of controlling the conduction type of the semiconductor to the first conduction type, around the circumferential side of the carrier transport layer 605-1. The density of the impurity included in the first semiconductor region is preferably equal to or less than $10^{17}$ (cm$^{-3}$), and more preferably, equal to or less than $10^{16}$ (cm$^{-3}$).

From the viewpoint of being completely depleted, the carrier transport layer 605-1 preferably comprises an intrinsic semiconductor or a semiconductor having a low impurity density close to an intrinsic semiconductor. The impurity density in the carrier transport layer 605-1 may be constant or continuously change.

Although in FIG. 3 the barrier layer 605-2 is connected to a channel stopper 606, the barrier layer 605-2 is not necessarily connected to the channel stopper 606. However, it is preferred that the potential of the barrier layer 605-2 is fixed.

The multiplication layer 807 connected to the connecting member 605 multiplies photocarriers generated in the light absorbing layer 608, and includes at least one step-back structure (a stepwise transition portion of the energy band formed when semiconductor layers, whose band gap is continuously changed from a narrow side to a wide side, are superposed). Ionization of electrons is accelerated utilizing this structure. The charge injection prohibiting layer 609 is provided in contact with a surface of the light absorbing layer 608 opposite to a surface contacting the multiplication layer 607. The charge injection inhibiting layer (blocking layer) 609 does not function as a barrier in the running direction of carriers, which provide a signal, taken from the light absorbing layer 608 or the multiplication layer 607, and is in ohmic contact with a transparent conductive layer 610, but functions as a barrier for the running of dark-current carriers in a direction reverse to the running direction of the above-described carriers.

Next, the schematic energy band of the photoconductive film 600 will be described with reference to FIGS. 4(a) and 4(b).

Figure 4A:
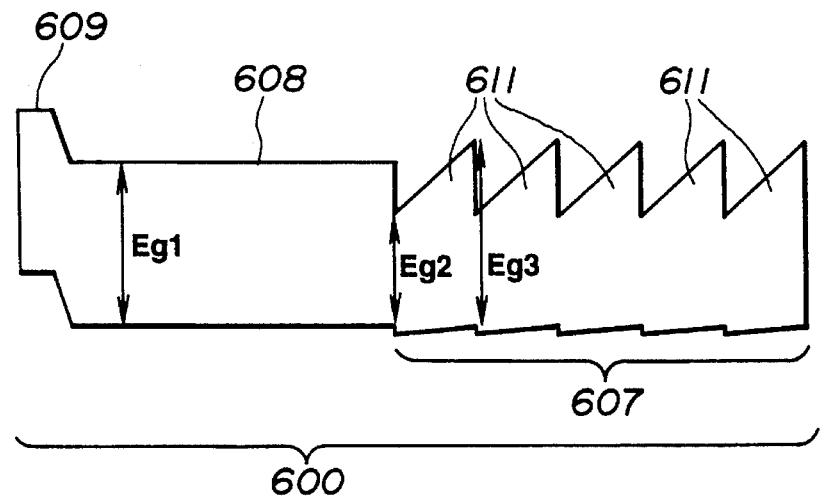
FIG. 4(a) is a schematic diagram illustrating the energy band of a photoconductive film of the laminated solid-state image pickup device shown in FIG. 3 when no bias voltage is applied.
Figure 4B:
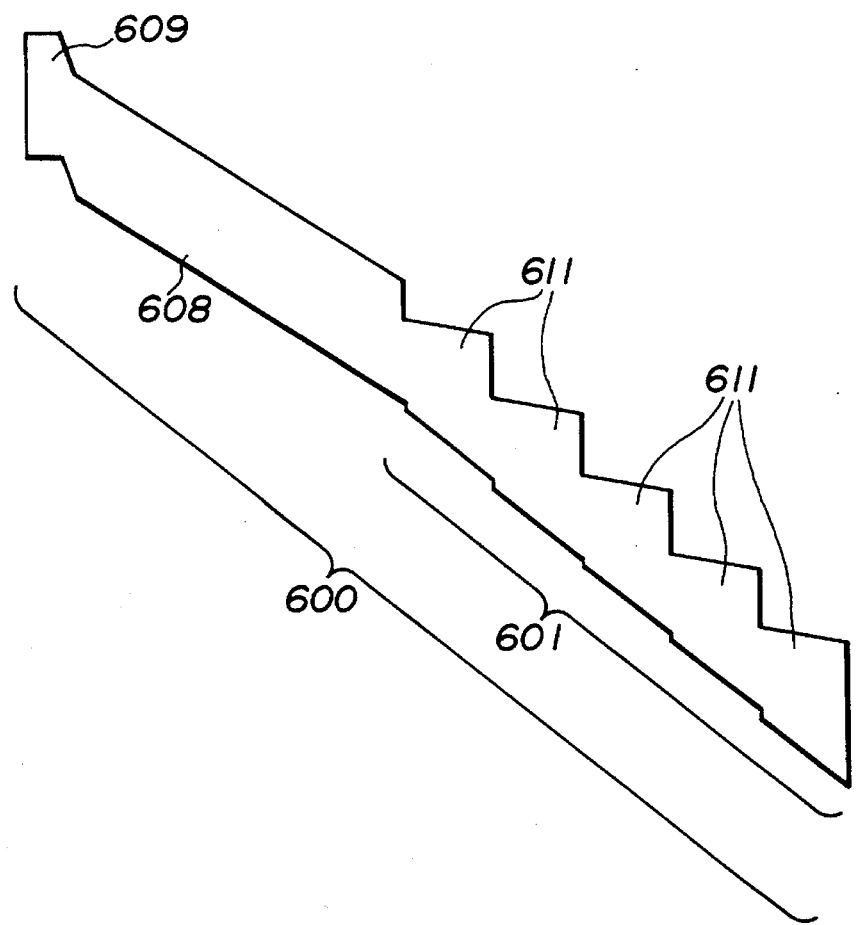
FIG. 4(b) is a schematic diagram illustrating the energy band of the photoconductive film shown in FIG. 4(a) when a reverse bias voltage is applied.
Figure 5A:
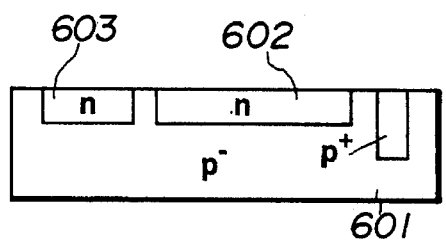
FIGS. 5 (a) through 5 (g) are diagrams illustrating the processes of a method for manufacturing the laminated solid-state image pickup device shown in FIG. 3 according to another embodiment of the present invention.
Figure 5B:
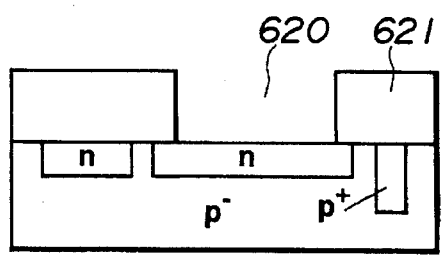
Figure 5C:
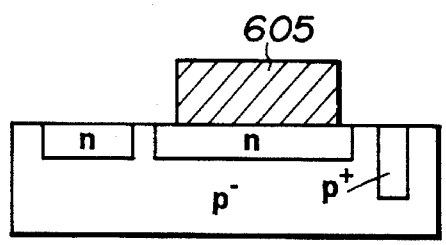
Figure 5D:
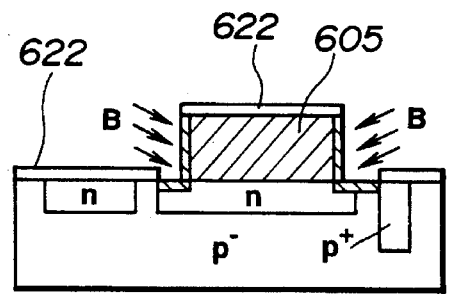
Figure 5E:
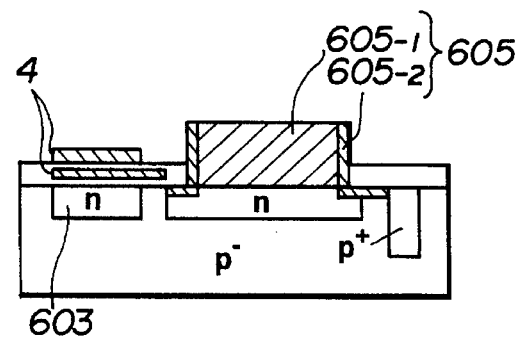
Figure 5F:
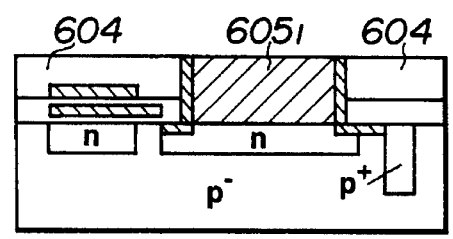
Figure 5G:
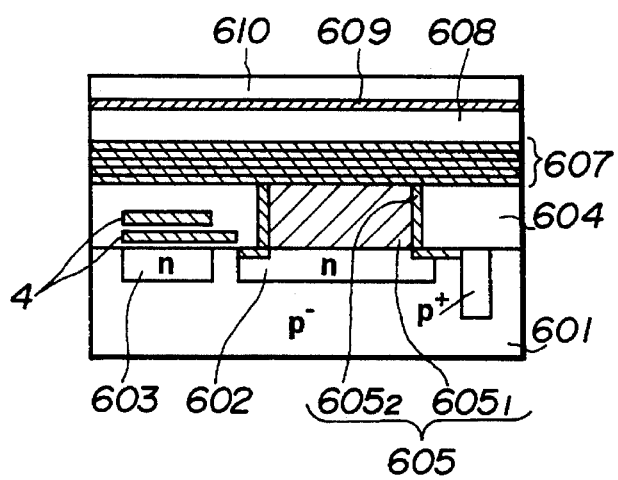

FIG. 4(a) is a diagram illustrating the schematic energy band of the photoconductive film 600 when no bias voltage is applied, and FIG. 4(b) is a diagram illustrating the schematic energy band of the photoconductive film 600 when a reverse bias voltage is applied.

As shown in FIG. 4(a), when no bias voltage is applied, the energy band of the photoconductive film 600 has a narrow band gap of Eg2 at the side of the light absorbing layer 608 having a band gap of Eg1. A plurality of (five in the case of FIG. 4(a)) laminated step-back-structure layers 611, in each of which the band gap increases from Eg2 to Eg3, are laminated, so that, as described above, a barrier for inhibiting the movement of carriers in a direction opposite to the side of the multiplication layer 607 contacting the light absorbing layer 608 is provided.

The thickness of the step-back-structure layer 611 is determined so as to cause carriers to run without being recombined. The thickness is preferably at least 50 Å and equal to or less than 1 μm, and more preferably, at least 200 Å and equal to or less than 1000 Å.

FIG. 4(b) illustrates the schematic energy band of the photoconductive film 600 when a reverse bias voltage is applied to the photoconductive film 600 having the energy-band structure shown in FIG. 4(a).

That is, the light absorbing layer 608 and the multiplication layer 607 are inclined by the function of the electric field. Since adjacent layers of the step-back-structure layers 611 of the multiplication layer 607 are connected at portions having different band gaps (i.e., Eg2 and Eg3), a step (ΔEc) corresponding to the difference between the band gaps is formed. If the value ΔEc is greater than the ionization energy, electrons are ionized to generate electron-hole pairs, whereby a multiplication function is provided.

The light absorbing layer 608 is provided closer to incident light than the multiplication layer 607. A non-single-crystalline semiconductor material, for example, an amorphous semiconductor material, such as a-Si (H, X), a-SiGe (H, X), a-SiC (H, X), a-SiGeC (H, X) or the like, a microcrystalline semiconductor material, such as μc (microcrystalline)-Si (H, X), μc-SiGe (H, X), μc-SiC (H, X) or the like, or a polycrystalline semiconductor material, such as poly-Si, poly-SiGe, poly-SiC or the like, can be used for the light-absorbing layer 608.

In order to provide sufficient sensitivity for visible light, the band gap Eg1 of the light absorbing layer 608 is preferably at least 1.1 eV and equal to or less than 1.8 eV, and more preferably, at least 1.2 eV and equal to or less than 1.8 eV.

In order to provide sensitivity also for infrared light, the band gap Eg1 is preferably at least 0.6 eV and equal to or less than 1.8 eV, and more preferably, at least 0.8 eV and equal to or less than 1.2 eV.

In order to provide sensitivity also for ultraviolet light, the band bap Eg1 is preferably at least 1.1 eV and equal to or less than 3.2 eV, and more preferably, at least 1.2 eV and equal to or less than 3.0 eV.

In order to provide high sensitivity for light having a desired wavelength and to efficiently operate within a wider range, the band gap Eg1 may not be uniform over the entire layer, but may be nonuniformly changed.

It is desirable that the thickness of the light absorbing layer 608 is enough for absorbing the wavelength of light to be subjected to photoelectric conversion.

In the present invention, a microcrystalline material indicates a material in which fine crystals having diameters of at least 30 Å and equal to or less than 500 Å are dispersed in an amorphous material.

The multiplication layer 607 is provided behind the light absorbing layer 608 as seen from the light incident side. When photocarriers generated in the light absorbing layer 608 are transported, the number of carriers are multiplied due to an avalanche effect.

The multiplication layer 607 has regions where carriers are drifted and regions where carriers are ionized. The multiplication layer 607 may comprise a material having a large dielectric constant and a material having a small dielectric constant which are alternately arranged. For example, layers having a large dielectric constant and layers having a small dielectric constant may be formed by changing the composition ratio of elements constituting the material. Alternatively, a region having a large dielectric constant and a region having a small dielectric constant may be formed within a single layer.

More specifically, as in the case of the above-described light absorbing layer 608, a non-single-crystalline material, for example, an amorphous material, such as a-Si (H, X), a-SiGe (H, X), a-SiC (H, X), a-SiGeC (H, X) or the like, a microcrystalline material, such as μc-Si (H, X), μc-SiGe (H, X), μc-SiC (H, X) or the like, or a polycrystalline material, such as poly-Si, poly-SiGe, poly-SiC or the like, can be used for the multiplication layer 607.

The charge injection inhibiting layer 609 is provided in front of the light absorbing layer 608 as seen from the light incident side. The charge injection inhibiting layer 609 may comprise the same material as the light absorbing layer 608 or the multiplication layer 607, to which an impurity capable of controlling the conductivity is added. The thickness of the charge injection inhibiting layer 609 is preferably at least 50 Å and equal to or less than 2000 Å, and more preferably, at least 100 Å and equal to or less than 300 Å.

The amount of the impurity added to the charge injection inhibiting layer 609 is determined so as to provide the charge injection inhibiting layer 609 with ohmic contact with the transparent conductive layer 610 and the above-described capability to block carrier injection. The conductivity of the charge injection inhibiting laye 609 is preferably at least $10^{-4}$ S/cm, and more preferably, at least $10^{-3}$ S/cm.

As for the material capable of controlling the conductivity, in the case of an amorphous-silicon-system material, an element which belongs to the group III of the periodic table is selected when obtaining a p-type material, and an element which belongs to the group V of the periodic table is selected when obtaining an n-type material.

More specifically, while B (boron), Al (alminum), Ga (gallium), In (indium), Tl (thallium) and the like can be cited as elements that belong to the group III of the periodic table, B and Ga are preferred. Similarly, while P (phosphor), As (arsenic), Sb (antimony), Bi (bismuth) and the like can be cited as elements that belong to the group V of the periodic table, P and Sb are preferred.

Oxigen (O) and nitrogen (N) may be added to each layer constituting the photoconductive layer 600 whenever necessary.

The charge injection inhibiting layer 609 may be made of a metal which is in Schottky contact with the adjacent semiconductor layer. Although in the present embodiment a case in which the multiplication layer 607 comprises five step-back-structure layers is illustrated, the present invention is not limited to such a case, but the multiplication layer 607 may comprises a single layer or at least two layers.

As described above, by forming the photoconductive film 600 by a non-single-crystalline semiconductor material, the film can be formed at a low temperature (for example, 200°–300° C.) using plasma CVD or the like, and the band gap can be easily controlled by changing the composition ratio of elements. Accordingly, the multiplication layer having the step-back structure can be easily formed, and a relatively stable step-back structure can be realized because, for example, unnecessary diffusion of atoms due to heat is suppressed. Such an approach is advantageous in laminating a plurality of layers.

Although a description has been provided of the case in which the band gap of each layer constituting the multiplication layer continuously changes, the band gap may be changed stepwise. As described above, the band gap of the light absorbing layer may be constant or continuously change.

Next, a description will be provided of a method for manufacturing the laminated solid-state image pickup device shown in FIG. 3 according to another embodiment of the present invention, with reference to FIGS. 5(*a*)–5(*g*).

(a) First, a region of a desired conduction type is formed on a semiconductor substrate made of single-crystal silicon or the like. (In the present embodiment, an n-type region is formed as a region of a first conduction type, and a p-type region is formed as a region of a second conduction type.) A generally adopted method, such as ion implantation, thermal diffusion or the like, can be used for that purpose. (See FIG. 5(*a*).)

(b) Then, a first oxide film 621, whose thickness is greater than that of a connecting member to be formed, is formed, and a contact hole 620 is formed at a portion where the connecting member is to be formed. (See FIG. 5(*b*).)

(c) A material for forming a connecting member 605 having a desired thickness is formed within the contact hole 620, and the first oxide film 621 is removed. A selective crystal growth method is suitable for forming the connecting member 605. An impurity may be added in the connecting member 605, or may not intentionally be added. Impurity diffusion from the substrate may occur. (See FIG. 5(*c*).)

(d) a second oxide film 622 is deposited. After removing the second oxide film 622 at least from the circumference of the connecting member 605, an impurity region of the second conduction type is formed by doping boron (B) atoms. The impurity region may be formed not only at the circumference of the connecting member 605, but also at the surface of the accumulating capacitance, the connecting portion with the channel stopper or the like whenever necessary. More specifically, a generally adopted method, such as thermal diffusion, plasma doping or the like may be used for forming such an impurity region. (See FIG. 5(*d*).)

(e) The second oxide film 622 is removed, and a desired signal reading circuit is formed. In FIG. 5(*e*), a CCD is illustrated as such a signal reading circuit. However, the circuit is not limited to the CCD in the present embodiment. (See FIG. 5 (*e*).)

(f) An interlayer insulating film 604 is deposited to provide a flat surface, and the surface of the connecting member 605 is exposed. The flat surface is obtained, for example, by forming a flat surface by coating a resist on an oxide film, and performing RIE (reactive ion etching) under conditions in which the etching rate equals for the resist and the silicon oxide film (etchback). (See FIG. 5(*f*).)

(g) After sequentially forming a multiplication layer 607, a light absorbing layer 608, a charge injection inhibiting layer 609 to provide a photoconductive film 600, a transparent conductive layer 610 is formed as a transparent electrode.

According to the above-described procedures, the laminated solid-state image pickup device shown in FIG. 3 can be manufactured.

By adopting the above-described manufacturing process, the connecting member for transporting carriers can be formed at a high temperature process. Hence, it is possible to provide a connecting member having a low defect density, which is very effective in reducing residual images.

In the laminated solid-state image pickup device shown in FIG. 3, an effective photosensing region comprises a region indicated by broken lines, so that the electric field is uniformly applied from the photoconductive film to the accumulating portion, and a depleted state can be realized.

That is, in the device shown in FIG. 3, the barrier layer 605-2 provided around the connecting member 605 provides a high potential for carriers transported to the accumulating capacitance 602, so that a completely depleted state can be realized between the photoconductive film 600 and the accumulating capacitance 602, and capacitive residual images are drastically reduced.

In general, in laminated solid-state image pickup devices, the photosensitivity decreases as the area of the photosensing region is reduced. In the present embodiment, however, since the multiplication layer 607 having a function of multiplying photocarriers is used, higher photosensitivity can be obtained. For example, if the multiplication layer 607 comprises five step-back-structure layers 611, photocarriers are multiplied by $2^5=32$ times.

Accordingly, even if the area of the photosensing region of the laminated solid-state image pickup device of the present embodiment is reduced to 1/10 of the area of the photosensing region of a laminated solid-state image pickup device not having a multiplication layer, the photosensitivity increases by substantially about three times. It is, of course, possible to further increase the photosensitivity by increasing the number of step-back-structure layers.

In addition, in the laminated solid-state image pickup device of the present embodiment, a region between adjacent photosensing regions substantially becomes a pixel separation region, and the photoconductive film 600 on the barrier layer 605-2 provides a potential barrier in the direction of adjacent pixels for carriers transported in the direction of the accumulating capacitance 602. Hence, it is possible to reduce crosstalk between pixels, and to realize higher resolution.

Figure 6:
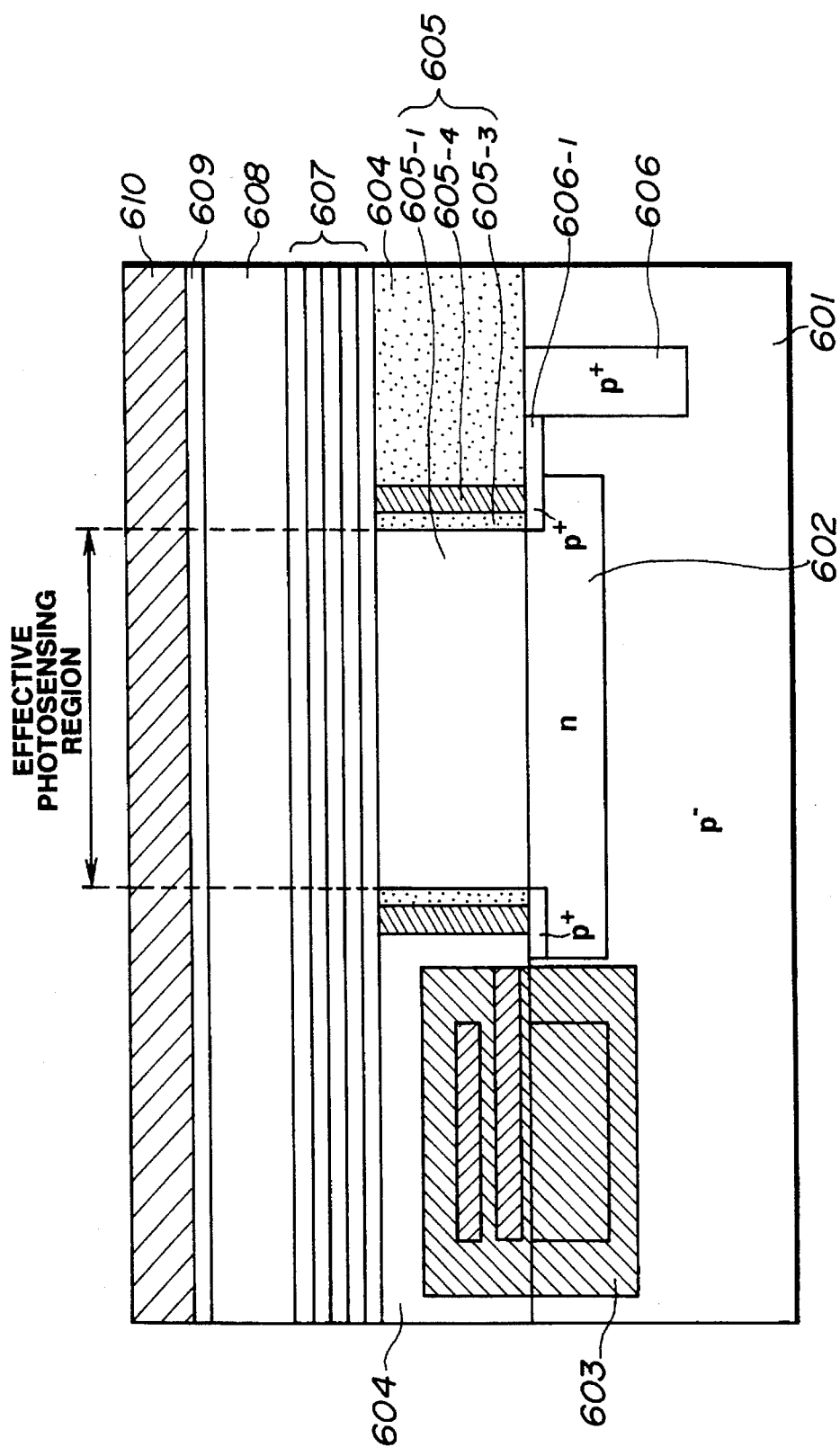
FIG. 6 is a schematic cross-sectional view illustrating the structure of a laminated solid-state image pickup device according to still another embodiment of the present invention.

FIG. 6 is a schematic cross-sectional view of a laminated solid-state image pickup device according to still another embodiment of the present invention.

In FIG. 6, components having the same reference numerals as in FIG. 3 are the same components as those shown in FIG. 3.

The laminated solid-state image pickup device shown in FIG. 6 differs from that shown in FIG. 3 in that a connecting member 605 has a configuration which is different from that of the connecting member shown in FIG. 3.

That is, the connecting member 605 of the laminated solid-state image pickup device shown in FIG. 6 comprises a carrier transport layer 605-1, comprising a semiconductor region that includes a very small amount of impurity capable of controlling the conduction type of the semiconductor to intrinsic or a first conduction type, or that includes an impurity capable of controlling the conduction type of the semiconductor to the first conduction type more than an impurity capable of controlling the conduction type of the semiconductor to a second conduction type, an insulating layer 605-3 surrounding the circumferential side of the carrier transport layer 605-1, and a conductive material 605-4 provided around the insulating layer 605-3. The carrier transport layer 605-1 can be formed in the same manner as described with reference to FIG. 3.

In the device shown in FIG. 6, the barrier layer 605-2 shown in FIG. 3 is not provided around the carrier transport layer 605-1. Instead of the barrier layer 605-2, the insulating layer 605-3 and the conductive material 605-4 are provided.

An inorganic insulating material is preferred for the insulating layer 605-3. More specifically, an oxide, such as silicon oxide or the like, or a nitride, such as silicon nitride or the like, can be preferably used for the insulating layer 605-3.

As for the conductive material 605-4, a metal, such as alminum (Al), chromium (Cr), copper (Cu), tungsten (W), titanium (Ti), molybdenum (Mo), platinum (Pt), gold (Au) or the like, an alloy which is made of some of these metals or which includes at least one of these metals, a low-resistivity semiconductor, such as polysilicon or the like, a compound, such as molybdenum silicide, platinum silicide, aluminum silicide or the like, which can be generally used as an interconnection material in the field of semiconductor technology, can be used.

Also in this embodiment, the connecting member 605 is made of an instrinsic semiconductor, or a semiconductor having a low impurity density close to an intrinsic semiconductor. The impurity density may be constant or continuously change.

The photoconductive film described with reference to FIG. 3 can, of course, be used as the photoconductive film of the laminated solid-state image pickup device shown in FIG. 6.

In FIG. 6, the conductive material 605-4 is connected to a region 606-1 of the second conduction type on the surface of the accumulating capacitance, and a channel stopper 606 of the second conduction type channel stopper 606. However, the conductive material 605-4 is not necessarily electrically connected to these portions. The potential of the conductive material 605-4 is preferably fixed. However, the potential may be changed in synchronization with an operation, such as reset, charge acculation, reading or the like, of the laminated solid-state image pickup device.

Next, a description will be provided of a process of manufacturing the laminated solid-state image pickup device shown in FIG. 6, with reference to FIGS. 7(a) through 7(h).

(a) First, a region of a desired conduction type is formed on a semiconductor substrate made of single-crystal silicon or the like. A generally adopted method, such as ion implantation, thermal diffusion or the like, can be used for that purpose. (See FIG. 7(a).)

(b) Then, a first oxide film 621, whose thickness is greater than that of a connecting member to be formed, is deposited on the semiconductor substrate, and a contact hole 620 is formed at a portion where the connecting member is to be formed. (see FIG. 7(b).)

(c) A material for forming a connecting member 605 (a material for forming a channel transport layer in the present emodiment) having a desired thickness is formed within the contact hole 620, and the first oxide film 621 is removed. A selective crystal growth method is suitable for forming the connecting member 605. An impurity may be added in the connecting member 605, or may not intentionally be added. Impurity diffusion from the substrate may occur. (See FIG. 7 (c).)

(d) A second oxide film, which is to become an insulating layer 605-3, is formed on the circumferential side of the material for forming the connecting member 605. In order to provide an excellent interface between the semiconductor and the oxide film of the connecting member 605, a thermal oxidation process is preferred for forming the oxide film. Thereafter, contact holes 633 are opened on portions of the $p^+$ regions 606-1 by RIE. (See FIG. 7(d).)

(e) A conductive material is formed on the contact portions of the $p^+$ regions 606-1 and the oxide film (the insulating layer 605-3) on the circumferential side of the connecting member. A commonly used method for forming a thin film, such as vacuum deposition, sputtering, CVD (chemical vapor deposition) or the like, can be used for forming the conductive material. However, from the viewpoint of depositing the conductive material on the circumferece of the connecting member, CVD, which has an excellent step coverage property, is preferred. Thereafter, unnecessary portions other than the circumferential side of the connecting member and unnecessary portions of an oxide film used as a mask for depositing the conductive material are etched off. (See FIG. 7(e).)

Figure 7A:
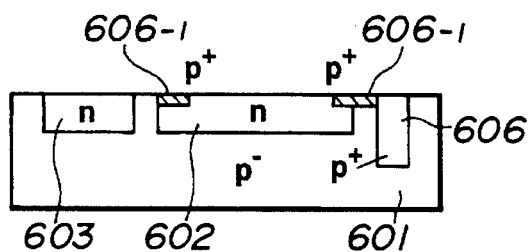
FIGS. 7(a) through 7(h) are diagrams illustrating the processes of a method for manufacturing the laminated solid-state image pickup device shown in FIG. 6 according to yet another embodiment of the present invention.
Figure 7E:
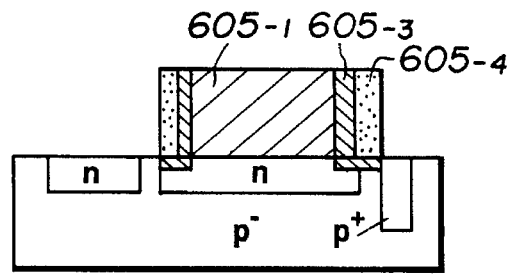
Figure 7B:
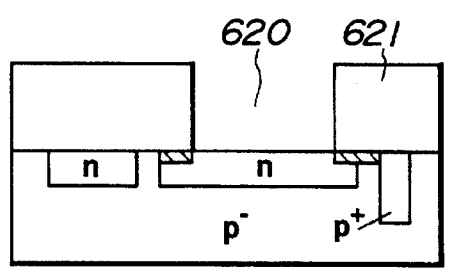
Figure 7F:
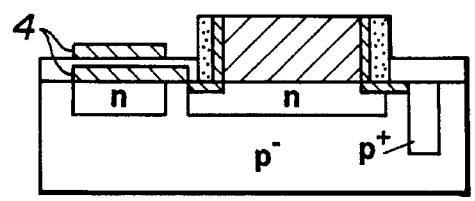
Figure 7C:
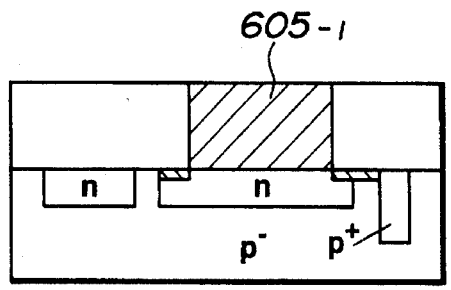
Figure 7G:
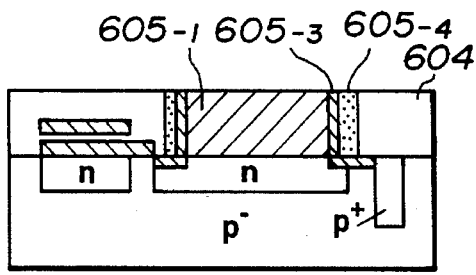
Figure 7D:
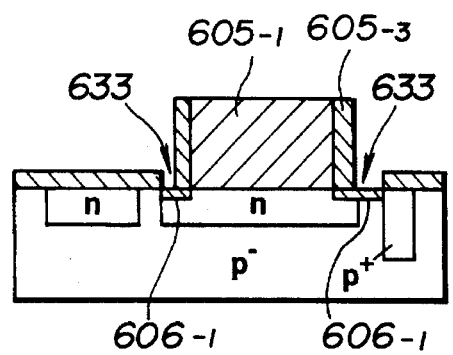
Figure 7H:
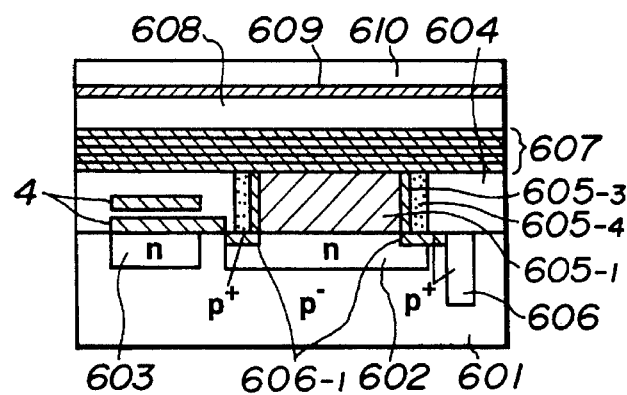

(f) A desired signal reading circuit is formed. In FIG. 7(f), a CCD is illustrated as such a signal reading circuit. However, the circuit is not limited to the CCD in the present embodiment. (See FIG. 7(f).)

(g) An interlayer insulating film 604 is deposited to provide a flat surface, and the surface of the connecting member 605 is exposed. The flat surface is obtained, for example, by forming a flat surface by coating a resist on an oxide film, and performing RIE under conditions in which the etching rate equals for the resist and the silicon oxide film (etchback). (See FIG. 7(g).)

(h) After sequentially forming a multiplication layer 607, a light absorbing layer 608, a charge injection inhibiting layer 609 to provide a photoconductive film 600, a transparent conductive layer 610 is formed as a transparent electrode.

In the present embodiment, the conductive material 605-4 is electrically connected to the $p^+$ region 606-1 on the surface of the charge accumulating portion and the channel stopper 606. However, these portions are not necessarily electrically connected, and a potential may be applied independently to the conductive member 605-4.

As in the case of the laminated solid-state image pickup device shown in FIG. 3, in the laminated solid-state image pickup device shown in FIG. 6, an effective photosensing region comprises a region indicated by broken lines.

By providing the conductive material 605-4 around the connecting member 605 with a desired potential, the neighborhood of the interface between the carrier transport layer 605-1 and the insulating layer 605-3 of the connecting member 605 can provide a high potential for carriers transported to the accumulating capacitance.

It is thereby possible to realize a complete depleted state between the photoconductive film 600 and the accumulating capacitance portion, so that capacitive residual images can be drastically reduced.

In general, the photosensitivity decreases as the area of the photosensing region is reduced. Also in the present embodiment, since the multiplication layer 607 having a function of multiplying photocarriers is used, higher photosensitivity can be obtained. For example, if the multiplication layer 607 comprises five step-back-structure layers 611, photocarriers are multiplied by $2^5=32$ times.

In the laminated solid-state image pickup device shown in FIG. 6, a pixel separation region substantially increases because it is situated at a portion separated from the connecting member 605. By providing a desired potential to the conductive material 608-4, a potential barrier for carriers transported in the direction of the accumulating capacitance is formed on the photoconductive film on the conductive material in the direction of adjacent pixels. Hence, crosstalk between pixels is reduced, and higher resolution can be realised.

According to the manufacturing method described with reference to FIGS. 7(a) through 7(h), the carrier transport layer of the connecting member for transporting carriers can be formed by a high-temperature process, and the carrier transport layer and the interface between the carrier transport layer and the insulating layer having a low defect density can be realized, so that residual images can be greatly reduced.

As described above, in the present embodiment, it is possible to provide the laminated solid-state image pickup device with high sensitivity, low residual images and higher resolution, which have previously been very difficult to realize.

EXAMPLE 1

Figure 8:
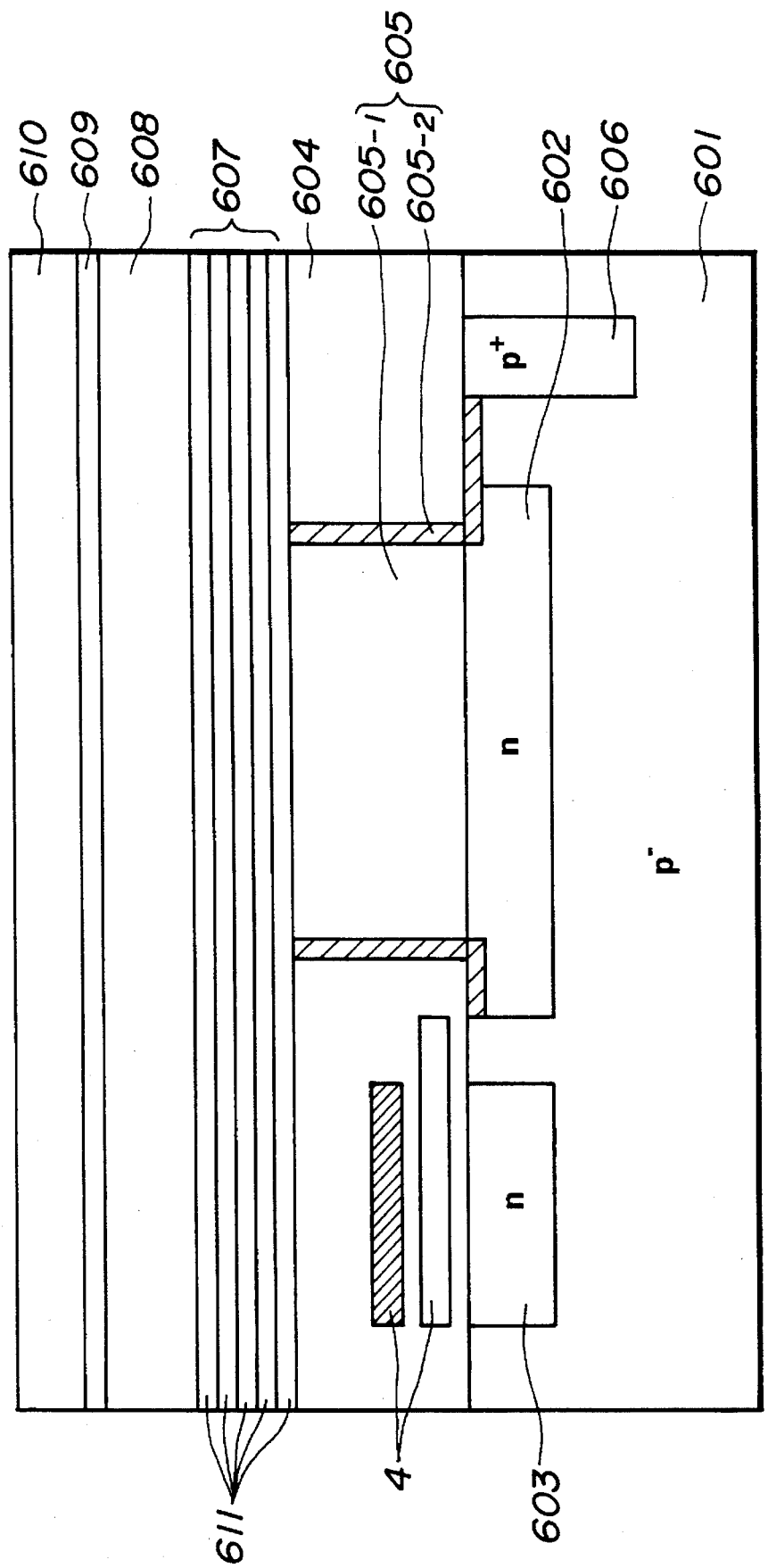
FIGS. 8 through 10 are schematic cross-sectional views illustrating laminated solid-state image pickup devices according to still another embodiments of the present invention.

In the present embodiment, a laminated solid-state image pickup device, in which a photoconductive film is laminated on a semiconductor circuit substrate having a CCD formed therein, shown in FIG. 8 is manufactured.

First, a $p^+$ region, serving as a channel stopper 606, and n regions, serving as an accumulating diode 602 and a vertical CCD 603, are formed on a p-type single-crystal silicon substrate 601.

Thereafter, an oxide film, which is thicker than a connecting member 605, is formed, contact holes are opened on the accumulating diode 602, and the connecting member 605 is formed by selective crystal growth using low-pressure CVD. The selective crystal growth is performed under the conditions of a substrate temperature of 950° C., 150 SLM (standard liter per minute) of hydrogen, 0.5 SLM of dichlorosilane, 1.8 SLM of hydrogen chloride, a pressure of 80 Torr, and the deposition speed is 0.3 μm/min.

After forming the connecting member 605, the oxide is removed by etching. Thereafter, an oxide film is formed again, patterning is performed, and a $p^+$ region, serving as a barrier layer 605-2, is formed in the circumferential side of the connecting member 605 and the suface portion of the accumulating diode 602 up to the channel stopper region. The $p^+$ region is formed by heating the substrate in the atmosphere of BBr. First, boron is deposited under the conditions of 1.0 SLM of nitrogen, 0.2 SLM of oxigen, 120 mg of BBr, and a substrate temperature of 1000° C., and is then diffused for 20 minutes at 1100° C.

Thereafter, the oxide film is removed, whereby the connecting member used in the present embodiment can be formed on the semiconductor substrate.

Then, a gate oxide film and silicon electrodes 4 are formed using an ordinary CCD manufacturing process.

Subsequently, an oxide film, serving as an interlayer insulating film 604, is formed, and a flat surface is provided using an etchback method. When the surface of the connecting member 605 has appeared, etching is stopped.

Thereafter, a multiplication layer 607, a light absorbing layer 608 and a charge injection inhibiting layer 609 are formed using a capacitive-coupling plasma CVD apparatus. A step-back structure 611 comprises a composition changing layer in which the composition ratios between carbon and silicon and between germanium and silicon are continuously changed so that a continuous band gap from amorphous silicon carbide to amorphous silicon germanium is provided.

The composition changing layer is manufactured in the following manner. That is, $SiH_4$, $GeH_4$, $CH_4$ and $H_2$ are used as raw-material gases. The flow rate of each gas is controlled by an independent mass-flow controller (hereinafter termed an "MFC"), and the gas is supplied to a film forming chamber. The MFC is controlled by a computer, and can control the flow rate of each gas so as to provide a band gap having a desired profile.

First, film deposition is started using $SiH_4$, $CH_4$ and $H_2$ as raw-material gases. After the start of the film deposition, the flow rate of $CH_4$ is reduced at a constant rate. When the flow rate of $CH_4$ has become 0, the flow rate of $GeH_4$ is increased at a constant rate. When the thickness of the multiplication layer 607 has reached a desired value, discharge is stopped.

That is, the flow rates of GeH$_4$ and CH$_4$ are controlled so that a band gap having a desired profile is obtained for a desired thickness of the composition changing layer.

In the present embodiment, the flow rate control is performed so that the thickness of each step-back-structure layer 611 constituting the multiplication layer 607 is about 200 Å, and the minimum band-gap value Eg1 is 1.4 eV, and the maximum band-gap value Eg2 is 3.0 eV.

By repeating the above-described processing, five step-back-structure layers 611 are manufactured. Thereafter, siH$_4$ and H$_2$ are selected as raw-material gases, and a amorphous-silicon film, serving as the light absorbing layer 608, 1 μm thick is formed. Then, B$_2$H$_6$ is added as a raw-material gas, and a p-type amorphous-silicon film, serving as the charge injection inhibiting layer 609, 500 Å thick is formed.

After consecutively forming the multiplication layer 607, the light absorbing layer 608 and the charge injection inhibiting layer 609 in the above-described manner, an ITO (indium-tin oxide) film, serving as a transparent electrode 610, is formed by sputtering. Thus, the laminated solid-state image pickup device according to the manufacturing method of the present embodiment can be obtained. Although in the above-described embodiment the thickness of each step-back-structure layer 611 is about 200 Å, any other thickness mat be adopted within a range in which carriers can run without being recombined. However, a thinner layer is preferred because the value of the applied bias voltage can be reduced. Although in the above-described embodiment the thickness of the light absorbing laye 608 is about 1 μm, any other thickness may be adopted, provided that incident light does not reach the multiplication layer 607 after passing through the light absorbing layer 608.

Figure 1:
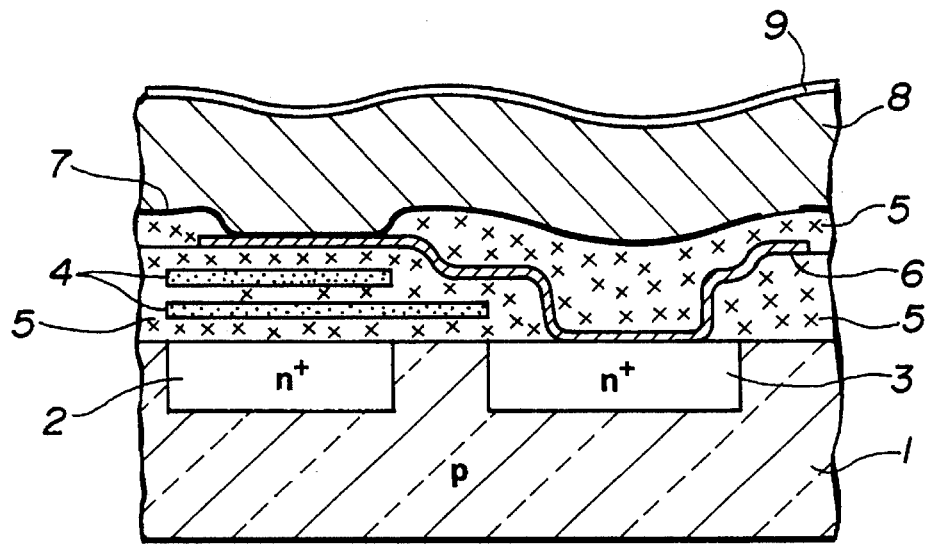
FIG. 1 is a schematic cross-sectional view illustrating a conventional laminated solid-state image pickup device.
Figure 2:
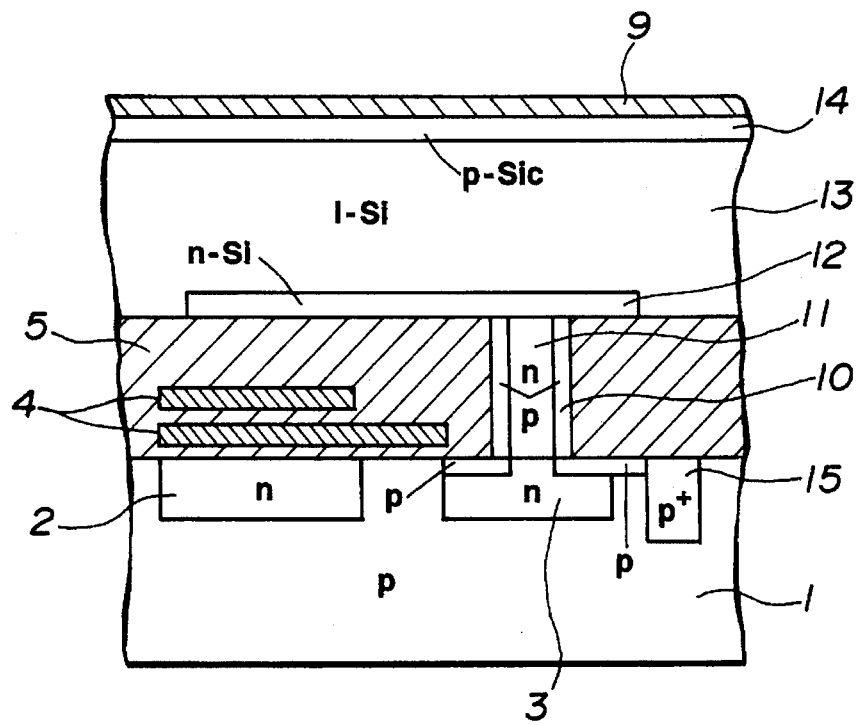
FIG. 2 is a schematic cross-secional view illustrating a conventional laminated solid-state image pickup device in which capacitive residual images are improved.

The following table indicates a result of comparison of residual-image characteristics of the third field of the laminated solid-state image pickup device according to the manufacturing method of the present embodiment (Example 1) with residual-image characteristics of the third field of the laminated solid-state image pickup device shown in FIG. 1 (Comparative Example 1).

| Light output (nA) | Example 1 | Comparative Example 1 |
| --- | --- | --- |
| 100 | 0.25% | 2.5% |
| 200 | 0.22% | 1.9% |
| 300 | 0.19% | 1.5% |

It can be considerd that this effect of reducing residual images is caused, particularly, by the use of the high-quality connecting member formed in the high-temperature process. Hence, it is verified that the manufacturing method of the present embodiment is effective for providing a completely depleted state.

Although in the present embodiment a substrate having a CCD semiconductor circuit formed therein is used, any other substrate having a device, such as an MOS transistor, an SIT, a bipolar transistor or the like, formed therein may be used.

EXAMPLE 2

In the present embodiment, a description will be provided of a laminated solid-state image pickup device, in which a photoconductive film is laminated on a semiconductor circuit substrate having an MOS transistor formed therein.

Accordingly, the device of the present embodiment is substantially the same as that of the above-described Example 1 except that the signal reading circuit comprises the MOS transistor.

Figure 9:
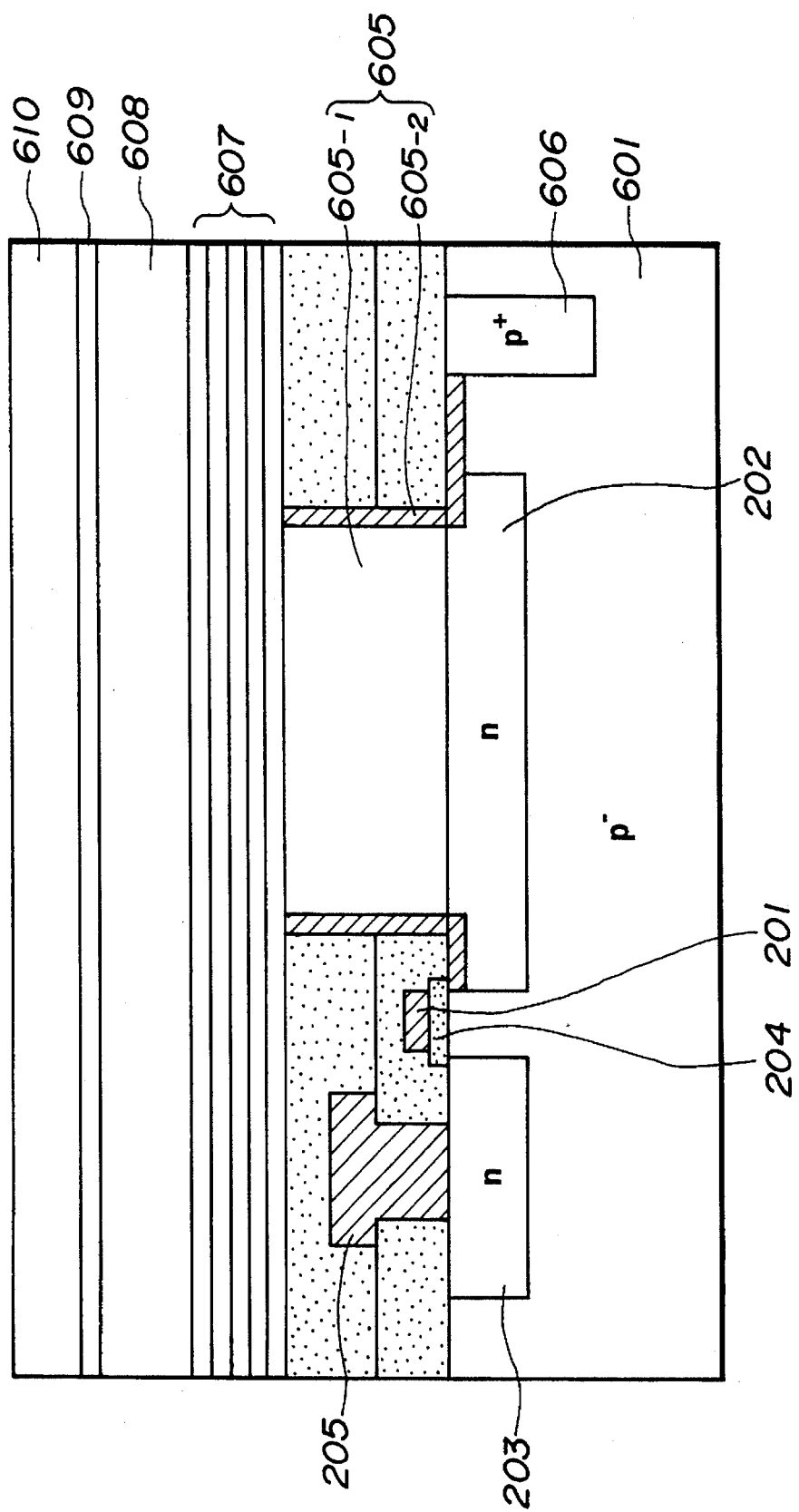

In FIG. 9, a p$^+$ region, serving as a channel stopper 606, and an n region, serving as a source 602, and an n region, serving as a drain 603, are formed on a p-type single-crystal silicon substrate 601. The region 202 also functions as an accumulating capacitance.

Thereafter, a connecting member 605 is formed, and a p$^+$ region, serving as a barrier layer 605-2, is formed in the circumferential side of the connecting member 605 and the suface portion of the region 602 up to a channel stopper region. The barrier layer 605-2 is formed by plasma doping. That is, the substrate is held in a capacitive-coupling plasma CVD apparatus, and boron is implanted into the surface of the connecting member 605 by flowing a hydrogen gas and a diborane gas and applying high-frequency power. Thereafter, the substrate is heated in a nitrogen atmosphere at 1000° C. to activate boron.

After forming the connecting member 605, a gate oxide film and a polysilicon film, serving as a gate 204 and an electrode 201, respectively, are formed. After depositing an oxide film, a contact hole is opened at a drain region, and an electrode 205 is formed. Then, an interlayer insulating film is deposited to provide a flat surface. Etching is stopped when the surface of the connecting member 605 has appeared.

Thereafter, a multiplication layer 607, a light absorbing layer 608 and a charge injection inhibiting layer 609 are formed. The multiplication layer 607 having step-back structures comprises composition changing layers in each of which the composition ratios between carbon and silicon abd between germanium and silicon is continuously changed so that a continuous band gap from amorphous silicon carbide to amorphous silicon germanium is provided. The light absorbing layer 608 comprises an amorphous-silicon film, and the charge injection inhibiting layer 609 comprises a p-type amorphous-silicon-carbide film.

After consecutively forming the multiplication layer 607, the light absorbing layer 608 and the charge injection inhibiting layer 609, an ITO film, serving as a transparent electrode 610, is formed by sputtering. Thus, the laminated solid-state image pickup device according to the manufacturing method of the present embodiment can be obtained.

EXAMPLE 3

Figure 10:
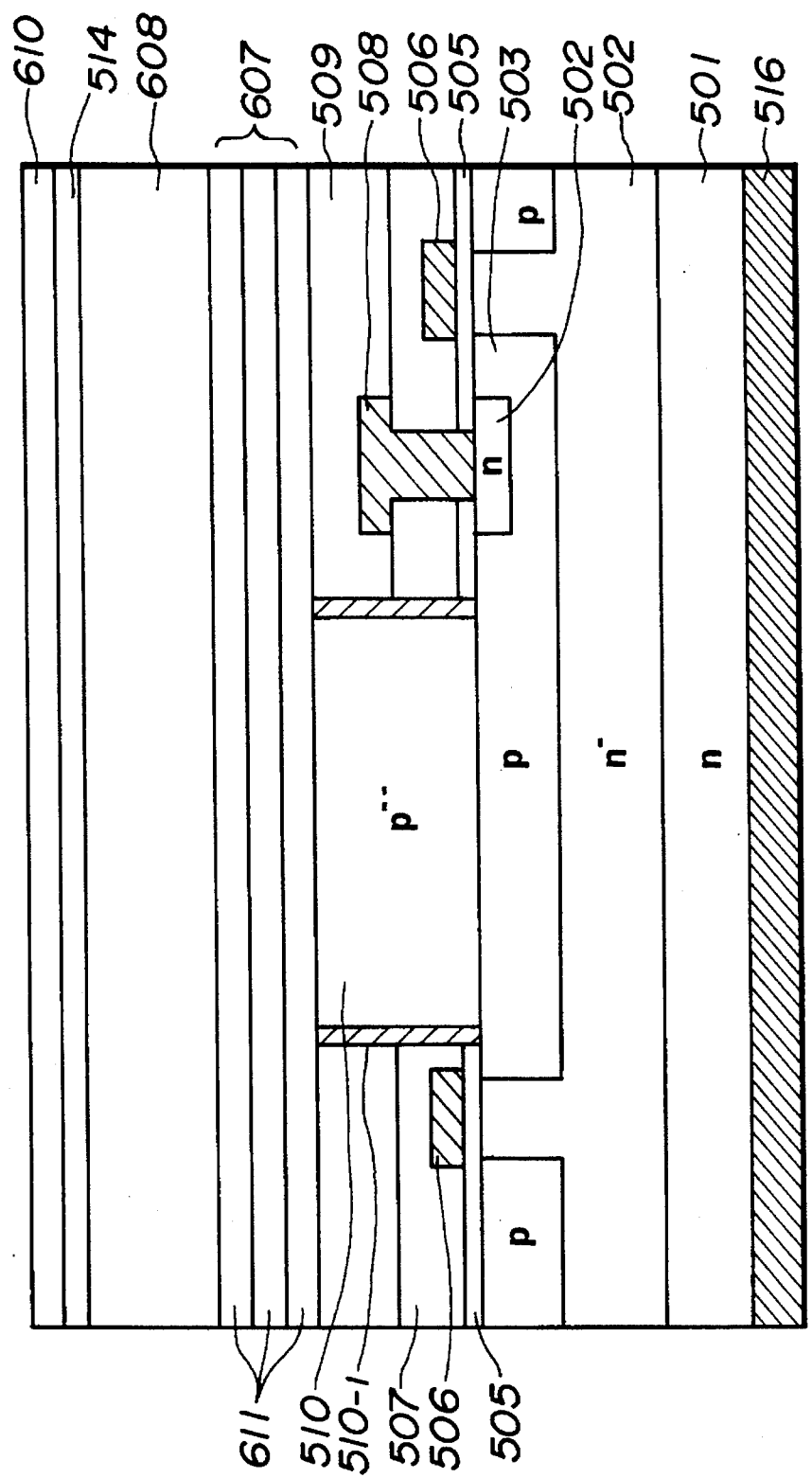
Figure 11:
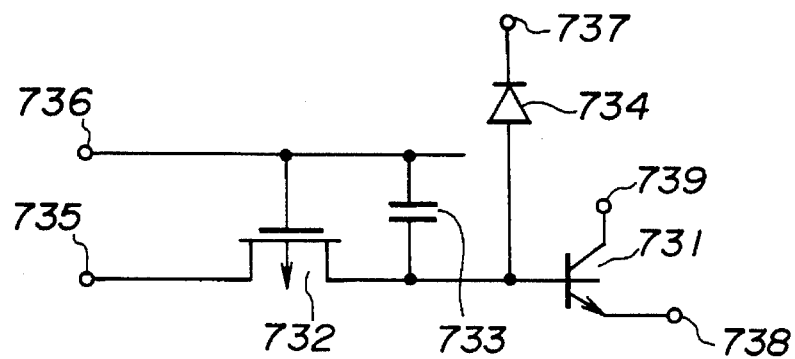
FIG. 11 is a diagram illustrating an equivalent circuit for one pixel of the laminated solid-state image pickup device shown in FIG. 10.
Figure 12:
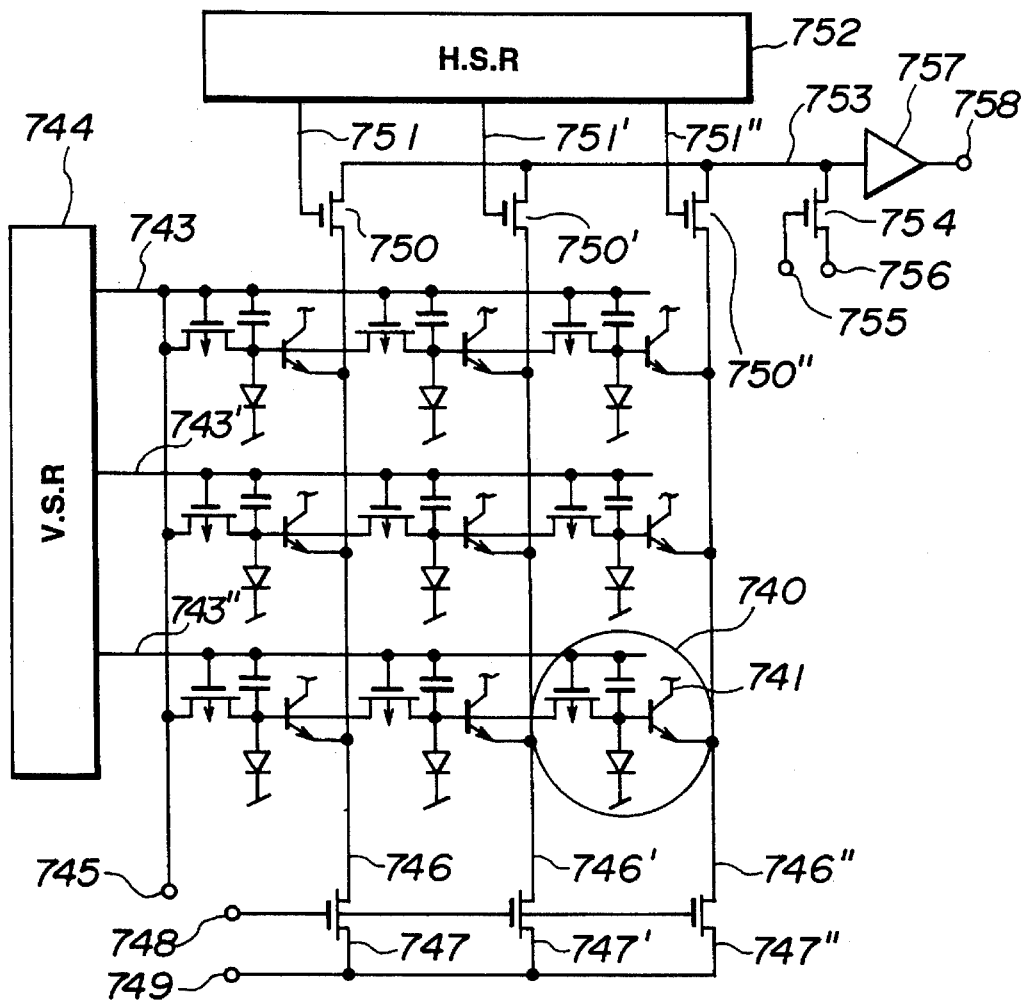
FIG. 12 is a diagram illustrating equivalent circuitry of the laminated solid-state image pickup device shown in FIG. 10.

In the present embodiment, a bipolar-transistor-type solid-state image pickup device is used as a semiconductor circuit substrate, and a photoconductive layer is laminated thereon. FIG. 10 is a schematic cross-sectional view of the neighborhood of a photosensing portion of the present embodiment. FIG. 11 is a diagram illustrating an equivalent circuit of a single pixel. FIG. 12 is a block diagram illustrating equivalent circuitry of the entire device.

In FIG. 10, an n$^-$ layer, serving as a collector region 502, is formed on an n-type silicon substrate 501 by epitaxial growth. A p base region 503 is formed in the n$^-$ region 502, and an n$^+$ emitter region 604 is formed in the p base region 503, so that a bipolar transistor is provided. A p$^-$ connecting member 510 is formed on the p base region 503, and an n region, serving as a barrier layer 510-1, is formed around the p$^-$ connecting member 510. The p base region is separated from the adjacent pixel, and a gate electrode 506 is formed between the p base region 503 and the adjacent p base region via an oxide film 505. Thus, a p-channel MOS transistor is provided by making two adjacent p base regions 503 a source region and a drain region. The gate electrode 506 also functions as a capacitor for controlling the potential of the p base regions 503.

After forming an insulating layer 507, an emitter electrode 508 is formed. Thereafter, an insulating layer 509 is formed to provide a flat surface. Then the surface of the connecting member 510 is exposed by etching the insulating layers 507 and 509 and the oxide layer 505.

Thereafter, by high-frequency plasma CVD, three composition changing layers 611, each having a step-back structure, constituting a multiplication layer 607, an amorphous-silicon film, serving as a light absorbing layer 608, and an n-type amorphous-silicon film, serving as a charge injection inhibiting layer 514, are consecutively formed, and an ITO film, serving as a transparent electrode 610, is formed. Each composition changing layer 611 comprises amorphous silicon germanium and microcrystalline silicon carbide. A collector electrode 516 is in ohmic contact with the back of the substrate 501. Although not illustrated, the barrier layer 510-1 is connected to the substrate 501.

FIG. 11 is diagram illustrating an equivalent circuit of a single pixel having the above-described structure. A p-channel MOS transistor 732, a capacitor 733 and a photoelectric transducer 734 are connected to the base of a bipolar transistor 731 made of crystalline silicon. There are also shown a terminal 735 for providing the base with a potential, a p-channel MOS transistor 732, a terminal 736 for driving the capacitor 733, a sensor electrode 737, an emitter electrode 738, and a collector electrode 739.

FIG. 12 is a diagram illustrating the configuration of circuitry in which pixel cells 740, each having the structure shown in FIGS. 10 and 11, are arranged in a 3×3 two-dimensional matrix.

In FIG. 12, a collector electrode 741 and a sensor electrode 742 are provided for each pixel cell 740.

The gate electrodes of p-MOS transistors and capacitor electrodes in each row are connected to the corresponding one of driving interconnections 743, 743' and 743", and are connected to a vertical shift register (V.S.R) 744.

The emitter electrodes of p-MOS transistors in each column are connected to the corresponding one of vertical interconnections 746, 746' and 746". The vertical interconnections 746, 746' and 746" are connected to switches 747, 747' and 747" for resetting electric charges in the vertical interconnections, and to reading switches 750, 750' and 750", respectively.

The gate electrodes of the reset switches 747, 747' and 747" are commonly connected to a terminal 748 for applying vertical reset pulses, and the source electrodes of the reset switches 747, 747' and 747" are connected to a terminal 749 for applying a vertical-line reset voltage.

The gate electrodes of the reading switches 750, 750' and 750" are connected to a horizontal shift register (H.S.R) via interconnections 751, 751' and 751", respectively, and the drain electrodes of the reading switches 750, 750' and 750" are connected to an output amplifier 757 via a horizontal reading interconnection 753. The horizontal reading interconnection 753 is connected to a switch 754 for resetting electric charges in the horizontal reading interconnection 753.

The reset switch 754 is connected to a terminal 755 for applying horizontal-interconnection reset pulses, and to a terminal 756 for applying a horizontal-interconnection reset voltage. The output of the amplifier 757 is taken from a terminal 758.

The operation of the device will now be briefly described with reference to FIGS. 10 through 12.

In FIG. 10, incident light is absorbed by the light absorbing layer 608. Generated carriers are multiplied by the multiplication layer 607 and are accumulated within the base region 503. When a driving pulse output from the vertical shift register 744 shown in FIG. 12 appears on the driving interconnection 743, the base potential is raised via the capacitor, and signal charges corresponding to the amounts of light are taken out on the vertical interconnections 746, 746' and 746" from the pixels on the first row.

Thereafter, when scanning pulses have been sequentially output to the interconnections 751, 751' and 751" from the horizontal shift register 752, the switches 750, 750' and 750" are sequentially subjected to on-off control, and signals are output to the output terminal 758 via the amplifier 757. At that time, the reset switch 754 is switched on when the switches 750, 750' and 750" are sequentially switched on, to remove residual electric charges in the horizontal interconnection 753. In the configuration of the present embodiment, reset in a completely depleted state can be performed in each of these reset operations, so that residual images due to insufficient reset can be reduced.

Thereafter, the vertical-line reset switches 747, 747' and 747" are switched on, and residual electric charges in the vertial interconnections 746, 746' and 746" are removed. When a pulse in the negative direction is supplied from the vertical shift register 744 to the driving interconnection 743, the p-MOS transistor of each pixel on the first row is turned on, so that residual electric charges in the base of the transistor are removed and the transistor is initialized.

Thereafter, a driving pulse output from the vertical shift register 744 appears on the driving interconnection 743', and pixel signals on the second row are taken out in the same manner.

Then, the same processing is performed for signal charges of each pixel on the third row.

By repeating the above-described processing, the laminated solid-state image pickup device manufactured by the method of the present embodiment operates.

EXAMPLE 4

Figure 13:
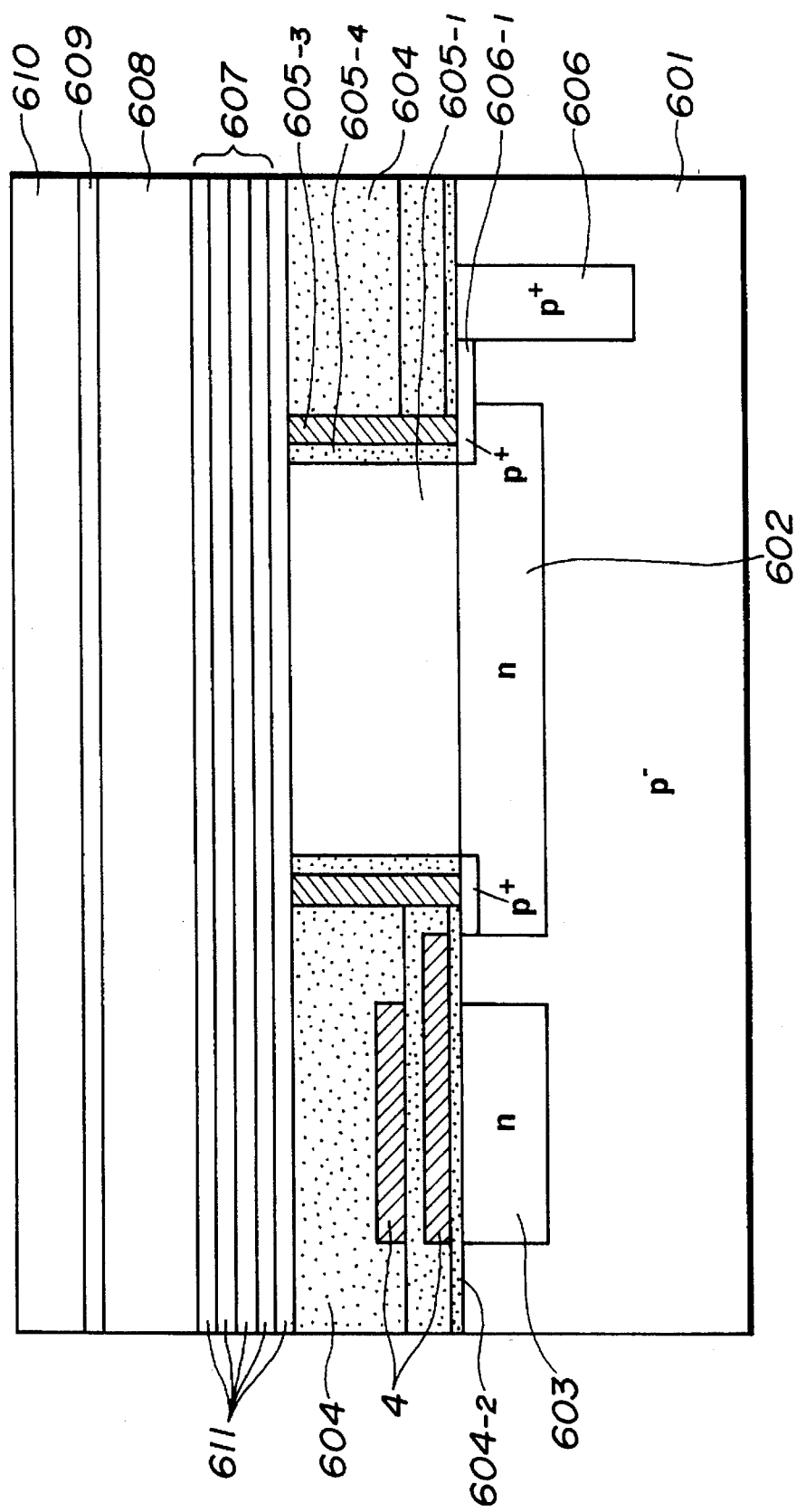
FIGS. 13 through 15 are schematic cross-sectional views illustrating laminated solid-state image pickup devices according to still another embodiments of the present invention.

A still another embodiment of the present invention will now be described with reference to FIG. 13.

In the present embodiment, a laminated solid-state image pickup device, in which a photoconductive film is laminated on a semiconductor circuit substrate having a CCD formed therein, is manufactured.

First, a $p^+$ region, serving as a channel stopper 606, and n regions, serving as an accumulating diode 602 and a vertical CCD 603, are formed on a p-type single-crystal silicon substrate 601.

Thereafter, an oxide film, which is thicker than a connecting member 605, is formed, contact holes are opened on the accumulating diode 602, and a carrier transport layer, serving as a connecting member 605-1, is formed by selective crystal growth using low-pressure CVD. The selective crystal growth is performed under the conditions of a substrate temperature of 950° C., 150 SLM (standard liter per minute) of hydrogen, 0.5 SLM of dichlorosilane, 1.8 SLM of hydrogen chloride, a pressure of 80 Torr, and the deposition speed is 0.3 μm/min.

After forming the connecting member 605-1, the oxide is removed by etching. Thereafter, an gate oxide film 604-2 of the CCD, and an oxide film, serving as an insulating layer 605-4 around the connecting member 605, are formed by thermal oxidation for 90 minutes at 1000° C. in an oxygen atmosphere, followed by annealing for 15 minutes at 1100° C. in an Ar atmosphere.

Thereafter, contact holes are opened on parts of the $p^+$ region by RIE, and tungsten electrodes 605-3 are formed by thermal CVD at a deposition temperature of 450° C. under a deposition pressure of 1.0 Torr with a $WF_6$ partial pressure of 0.11 Torr and a $H_2$ partial pressure of 0.3 Torr. Subsequently, tungsten portions other than the side of the connecting member 605 are removed by etching.

Then, a gate oxide film and polysilicon electrodes 4 are formed using an ordinary CCD manufacturing process. Subsequently, an oxide film, serving as an interlayer insulating film 604, is formed, and a flat surface is provided using an etchback method. When the surface of the connecting member 605-1 has appeared, etching is stopped.

Thereafter, a multiplication layer 607, a light absorbing layer 608 and a charge injection inhibiting layer 609 are formed using a capacitive-coupling plasma CVD apparatus. A step-back structure 611 comprises a composition changing layer in which the composition ratios between carbon and silicon and between germanium and silicon are continuously changed so that a continuous band gap from amorphous silicon carbide to amorphous silicon germanium is provided.

The composition changing layer is manufactured in the following manner. That is, $SiH_4$, $GeH_4$, $CH_4$ and $H_2$ are used as raw-material gases. The flow rate of each gas is controlled by an independent MFC and the gas is supplied to a film forming chamber. The MFC is controlled by a computer, and can control the flow rate of each gas so as to provide a band gap having a desired profile.

First, film deposition is started using $SiH_4$, $CH_4$ and $H_2$ as raw-material gases. After the start of the film deposition, the flow rate of $CH_4$ is reduced at a constant rate. When the flow rate of $CH_4$ has become 0, the flow rate of $GeH_4$ is increased at a constant rate. When the thickness of the multiplication layer 607 has reached a desired value, discharge is stopped. That is, the flow rates of $GeH_4$ and $CH_4$ are controlled so that a band gap having a desired profile is obtained for a desired thickness of the composition changing layer.

In the present embodiment, the flow rate control is performed so that the thickness of each step-back-structure layer 611 constituting the multiplication layer 607 is about 200 Å, and the minimum band-gap value Eg1 is 1.4 eV, and the maximum band-gap value Eg2 is 3.0 eV.

By repeating the above-described processing, five step-back-structure layers 611 are manufactured. Thereafter, $SiH_4$ and $H_2$ are selected as raw-material gases, and a amorphous-silicon films serving as the light absorbing layer 608, 1 μm thick is formed. Then, $B_2H_6$ is added as a raw-material gas, and a p-type amorphous-silicon film, serving as the charge injection inhibiting layer 609, 500 Å thick is formed.

After consecutively forming the multiplication layer 607, the light absorbing layer 608 and the charge injection inhibiting layer 609 in the above-described manner, an ITO (indium-tin oxide) film, serving as a transparent electrode 610, is formed by sputtering. Thus, the laminated solid-state image pickup device according to the manufacturing method of the present embodiment can be obtained.

Although in the above-described embodiment the thickness of each step-back-structure layer 611 is about 200 Å, any other thickness may be adopted within a range in which carriers can run without being recombined. However, a thinner layer is preferred because the value of the applied bias voltage can be reduced. Although in the above-described embodiment the thickness of the light absorbing laye 608 is about 1 μm, any other thickness may be adopted, provided that incident light does not reach the multiplication layer after passing through the light absorbing layer 608.

The following table indicates a result of comparison of residual-image characteristics of the third field of the laminated solid-state image pickup device according to the manufacturing method of the present embodiment (Example 4) with residual-image characteristics of the third field of the laminated solid-state image pickup device shown in FIG. 1 (Comparative Example 2).

| Light output (nA) | Example 4 | Comparative Example 2 |
|---|---|---|
| 100 | 0.27% | 2.5% |
| 200 | 0.24% | 1.9% |
| 300 | 0.22% | 1.5% |

It can be considerd that this effect of reducing residual images is caused, particularly, by the use of the high-quality connecting member formed in the high-temperature process. Hence, it is verified that the manufacturing method of the present embodiment is effective for providing completely depleted state.

Although in the present embodiment a substrate having a CCD semiconductor circuit formed therein is used, any other substrate having a device, such as an MOS transistor, an SIT, a bipolar transistor or the like, formed therein may be used.

EXAMPLE 5

In the present embodiment, a description will be provided of a laminated solid-state image pickup device in which a photoconductive film is laminated on a semiconductor circuit substrate having an MOS transistor formed therein.

The device of the present embodiment is substantially the same as that of the above-described Example 4 except that the signal reading circuit comprises the MOS transistor.

Figure 14:
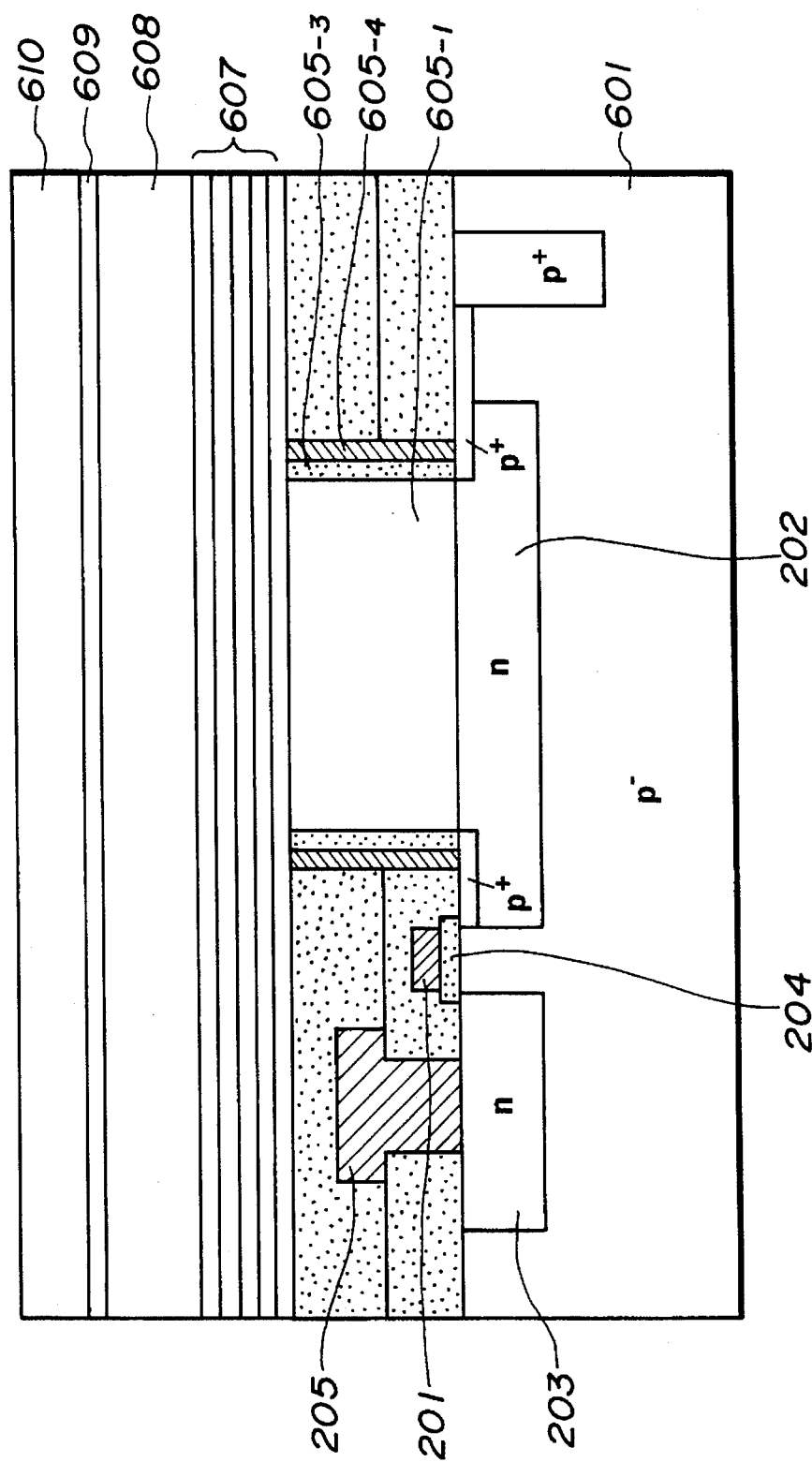

In FIG. 14, a $p^+$ region, serving as a channel stopper 606, and an n region, serving as a source 602, and an n region, serving as a drain 603, are formed on a p-type single-crystal silicon substrate 601. The region 202 also functions as an accumulating capacitance.

Thereafter, a carrier transport layer of a connecting member 605-1 is formed. Subsequently, in the same manner as in the case of Example 4, an oxide film, serving as an insulating layer 605-3, is formed around the connecting member 605-1, and a gate oxide film 204 is formed.

Then, a polysilicon electrode 605-4 and a gate electrode 201 are formed by low-pressure CVD under the deposition conditions of 500° C. and 1 Torr at a deposition rate of 75 Å/sec with $SiH_4/He=40\%$.

After depositing an interlayer insulating film, a contact hole is opened at a drain region, and a reading electrode 205 is formed. Then, an additional interlayer insulating film is deposited to provide a flat surface. Etching is stopped when the surface of the connecting member has appeared.

Thereafter, a multiplication layer 607, a light absorbing layer 608 and a charge injection inhibiting layer 609 are formed. The multiplication layer 607 having step-back structures comprises composition changing layers in each of which the composition ratios between carbon and silicon and between germanium and silicon is continuously changed so that a continuous band gap from amorphous silicon carbide to amorphous silicon germanium is provided. The light absorbing layer 608 comprises an amorphous-silicon film, and the charge injection inhibiting layer 609 comprises a p-type amorphous-silicon-carbide film.

After consecutively forming the multiplication layer 607, the light absorbing layer 608 and the charge injection inhibiting layer 609, an ITO film, serving as a transparent electrode 610, is formed by sputtering. Thus, the laminated solid-state image pickup device according to the manufacturing method of the present embodiment can be obtained.

EXAMPLE 6

Figure 15:
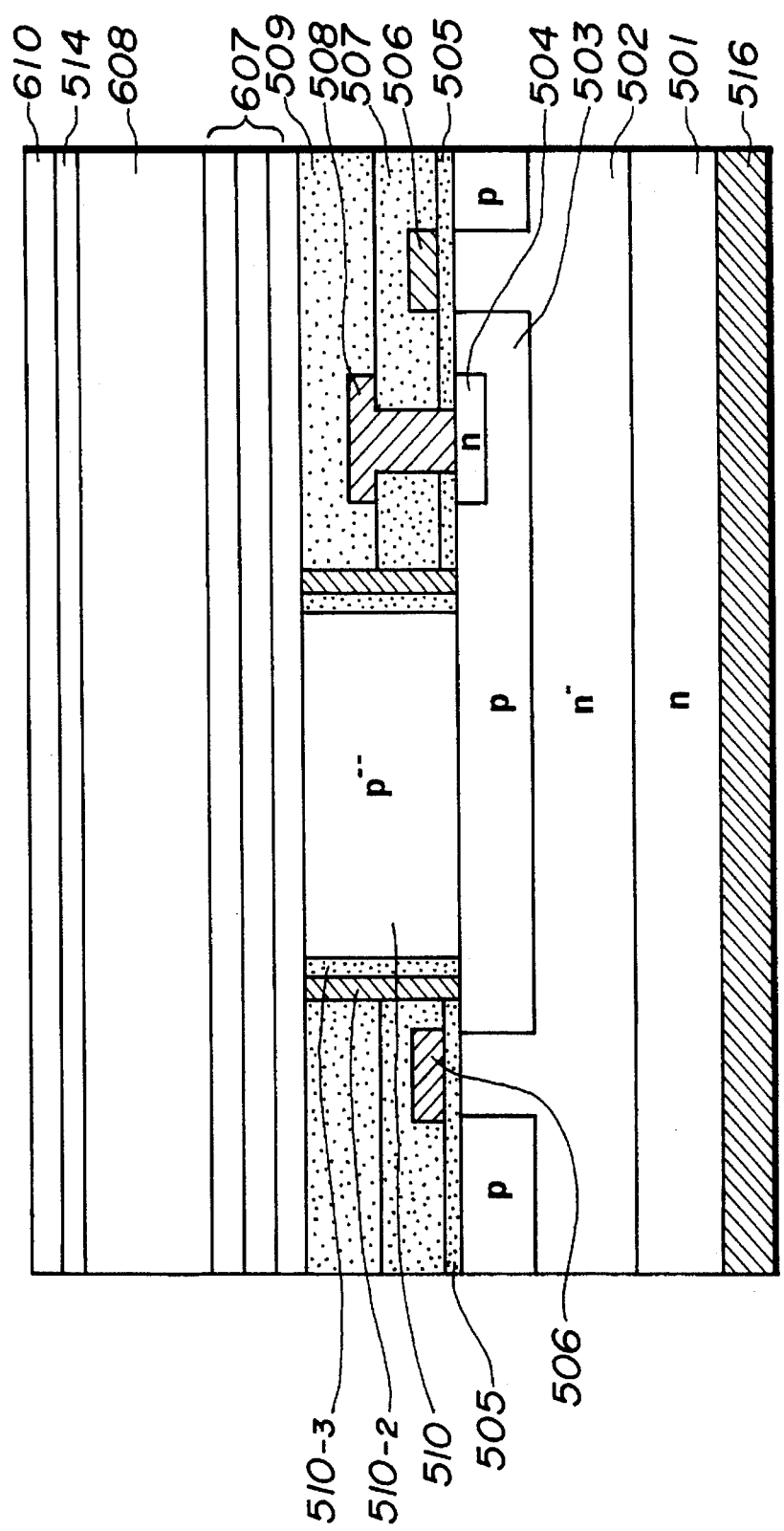

In the present embodiment, a bipolar-transistor-type solid-state image pickup device is used as a semiconductor circuit substrate, and a photoconductive layer is laminated thereon. FIG. 15 is a schematic cross-sectional view of the neighborhood of a photosensing portion of the present embodiment. The diagram illustrating an equivalent circuit of a single pixel shown in FIG. 11, and the block diagram illustrating equivalent circuitry of the entire device shown in FIG. 12 can also be used in the present embodiment.

In FIG. 15, an n$^-$ layer, serving as a collector region 502, is formed on an n-type silicon substrate 501 by epitaxial growth. A p base region 503 is formed in the n-region 502, and an n$^+$ emitter region 504 is formed in the p base region 503, so that a bipolar transistor is provided. A p$^-$ connecting member 510 is formed on the p base region 503, and an insulating layer 510-3 and a molybdenum silicide electrode 510-2 are formed around the p$^-$ connecting member 510 by the same process as that used in the case of Example 4.

The p base region is separated from the adjacent pixel, and a gate electrode 506 is formed between the p base region 503 and the adjacent p base region via an oxide film 505. Thus, a p-channel MOS transistor is provided by making two adjacent p base regions 503 a source region and a drain region. The gate electrode 506 also functions as a capacitor for controlling the potential of the p base regions 503.

After forming an insulating layer 507, an emitter electrode 508 is formed. Thereafter, an insulating layer 509 is formed to provide a flat surface. Then, the surface of the connecting member 510 is exposed by etching the insulating layers 507 and 509 and the oxide layer 505.

Thereafter, by high-frequency plasma CVD, three composition changing layers 611, each having a step-back structure, constituting a multiplication layer 607, an amorphous-silicon film, serving as a light absorbing layer 608, and an n-type amorphous-silicon film, serving as a charge injection inhibiting layer 514, are consecutively formed, and an ITO film, serving as a transparent electrode 610, is formed. Each composition changing later 611 comprises amorphous silicon germanium and microcrystalline silicon carbide.

A collector electrode 516 is in ohmic contact with the back of the substrate 501. Although not illustrated, the silicide electrode 510-2 is connected to the substrate 501.

The configurations and operations of the diagram illustrating an equivalent circuit of a single pixel shown in FIG. 11, and the diagram illustrating equivalent circuitry of the entire device shown in FIG. 12 are the same as those in the case of Example 3.

As described above, according to the present invention, a connecting member for transporting carriers can be formed at a high-temperature process, so that a connecting member having a low defect density can be realized, and residual images can be greatly reduced.

Since a reading unit is formed after the high-temperature process, the circuit of the reading unit is not adversely influenced by the high-temperature process.

In the present invention, the electric field is uniformly applied from a photoconductive film to an accumulating capacitance portion, and a depleted state can be realized.

In general, the photosensitivity decreases as the area of the photosensing region is reduced. In the present invention, however, since a multiplication layer having a function of multiplying photocarriers is used, higher photosensitivity can be obtained with the same area of the photosensing region compared with a case in which such a multiplication layer is not used. For example, if the multiplication layer comprises five step-back-structure layers, photocarriers are multiplied by $2^5=32$ times.

Accordingly, even if the area of the photosensing region of the laminated solid-state image pickup device of the present invention is reduced to 1/10 of the area of the photosensing region of a laminated solid-state image pickup device not having a multiplication layer, the photosensitivity increases by substantially about three times. It is, of course, possible to further increase the photosensitivity by increasing the number of step-back-structure layers.

The laminated solid-state image pickup device of the present invention is advantageous in that the pixel separation region is greater than that of conventional laminated solid-state image pickup devices, and therefore crosstalk between pixels is small.

As described above, according to the present invention, it is possible to provide a laminated solid-state image pickup device with high sensitivity and low remaining images which have previously been difficult to realize, and to supply a high-definition, high-sensitivity and low-cost solid-state image pickup device.

The individual components shown in outline in the drawings are all well known in the laminated solid-state image pickup device arts and their specific construction and operation are not critical to the operation or the best mode for carrying out the invention.

While the present invention has been described with respect to what is presently considered to be the preferred embodiments, it is to be understood that the invention is not limited to the disclosed embodiments. To the contrary, the present invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A laminated solid-state image pickup device comprising:

a semiconductor circuit substrate, comprising accumulating portions for accumulating electric signals, and reading means for reading the electric signals;

an insulating layer formed on said semiconductor circuit substrate except at at least parts of said accumulating portions;

connecting members formed in contact with said accumulating portions; and a photoconductive film laminated on said insulating layer and said connecting members, wherein said photoconductive film comprises a non-crystalline semiconductor configured by laminating a carrier multiplication layer, a light absorbing layer, a charge injection inhibiting layer of a second conduction type, and wherein each of said connecting members comprises a first semiconductor region of a first conduction type, instrinsic or having a low impurity density, surrounded by a second semiconductor region of the second conduction type.

2. A device according to claim 1, wherein each of said reading means comprises a device selected from a CCD (charge-coupled device), an MOS (metal oxide semiconductor) transistor, a static induction transistor, and a bipolar transistor.

3. A device according to claim 1, wherein said accumulating portions have a first conductive type.

4. A device according to claim 1, further comprising a transparent conductive layer on said photoconductive film.

5. A device according to claim 1, wherein said non-crystalline semiconductor includes silicon atoms.

6. A device according to claim 1, wherein said connecting members include silicon atoms.

7. A device according to claim 1, wherein said first semiconductor region of the first conduction type comprises a single crystal.

8. A device according to claim 7, wherein the single crystal comprises silicon.

9. A device according to claim 1, wherein said second semiconductor region of the second conduction type is connected to a channel stopper formed in said semiconductor circuit substrate.

10. A device according to claim 1, wherein said second semiconductor region of the second conduction type is connected to another semiconductor region of the same conduction type formed in said semiconductor circuit substrate.

11. A device according to claim 1, wherein said carrier multiplication layer multiplies carriers by an avalanche effect.

12. A device according to claim 1, wherein said carrier multiplication layer has at least one step-back structure.

13. A device according to claim 1, wherein said carrier multiplication layer comprises at least one layer having a mininum band gap of Eg2 and a maximum band gap of Eg3.

14. A device according to claim 13, wherein the band gap of the layer continuously changes from Eg2 to Eg3.

15. A device according to claim 13, wherein the energy difference between Eg3 and Eg2 is equal to or greater than the ionization energy.

16. A device according to claim 1, wherein said carrier multiplication layer comprises a plurality of layers, each having the minimum band gap Eg2 and the maximum band gap Eg3, and wherein the side of the minimum band gap Eg2 of at least one of the plurality of layers contacts the maximum band gap Eg3 of the adjacent layer.

17. A device according to claim 1, wherein said non-crystalline semiconductor comprises one of an amorphous semiconductor, a microcrystalline semiconductor and a polycrystalline semiconductor.

18. A device according to claim 12, wherein the thickness of a layer for forming the step-back structure is at least 50 Å and equal to or less than 1 μm.

19. A device according to claim 1, wherein said light absorbing layer is provided at a side closer to incident light than said carrier multiplication layer.

20. A device according to claim 1, wherein said connecting member is provided on the entire surfaces of said accumulating portions.

21. A laminated solid-state image pickup device comprising:

a semiconductor circuit substrate, comprising accumulating portions for accumulating electric signals, and reading means for reading the electric signals;

an insulating layer formed on said semiconductor circuit substrate except at at least parts of said accumulating portions;

connecting members formed in contact with said accumulating portions; and a photoconductive film laminated on said insulating layer and said connecting members, wherein said photoconductive film comprises a non-crystalline semiconductor configured by laminating a carrier multiplication layer, a light absorbing layer, a charge injection inhibiting layer of a second conduction type, and wherein each of said connecting members comprises a first semiconductor region of a first conduction type, instrinsic or having a low impurity density, surrounded by a conductive material.

22. A device according to claim 21, wherein each of said reading means comprises a device selected from a CCD, an MOS transistor, a static induction transistor, and a bipolar transistor.

23. A device according to claim 21, wherein said accumulating portions have a first conductive type.

24. A device according to claim 21, further comprising a transparent conductive layer on said photoconductive film.

25. A device according to claim 21, wherein said non-crystalline semiconductor includes silicon atoms.

26. A device according to claim 21, wherein said connecting members include silicon atoms.

27. A device according to claim 21, wherein said first semiconductor region of the first conduction type comprises a single crystal.

28. A device according to claim 27, wherein the single crystal comprises silicon.

29. A device according to claim 21, wherein said conductive material is connected to a channel stopper formed in said semiconductor circuit substrate.

30. A device according to claim 21, wherein said conductive material is provided on said first semiconductor region via an insulating layer.

31. A device according to claim 21, wherein said carrier multiplication layer multiplies carriers by an avalanche effect.

32. A device according to claim 21, wherein said carrier multiplication layer has at least one step-back structure.

33. A device according to claim 21, wherein said carrier multiplication layer comprises at least one layer having a mininum band gap of Eg2 and a maximum band gap of Eg3.

34. A device according to claim 23, wherein the band gap of the layer continuously changes from Eg2 to Eg3.

35. A device according to claim 23, wherein the energy difference between Eg3 and Eg2 is equal to or greater than the ionization energy.

36. A device according to claim 21, wherein said carrier multiplication layer comprises a plurality of layers, each having the minimum band gap Eg2 and the maximum band gap Eg3, and wherein the side of the minimum band gap Eg2 of at least one of the plurality of layers contacts the maximum band gap Eg3 of the adjacent layer.

37. A device according to claim 21, wherein said non-crystalline semiconductor comprises one of an amorphous semiconductor, a microcrystalline semiconductor and a polycrystalline semiconductor.

38. A device according to claim 22, wherein the thickness of a layer for forming the step-back structure is at least 50 Å and equal to or less than 1 μm.

39. A device according to claim 21, wherein said light absorbing layer is provided at a side closer to incident light than said carrier multiplication layer.

40. A device according to claim 21, wherein said connecting member is provided on the entire surfaces of said accumulating portions.

* * * * *

UNITED STATES PATENT AND TRADEMARK OFFICE
CERTIFICATE OF CORRECTION

PATENT NO. : 5,481,124

DATED : January 2, 1996

INVENTOR(S) : HIRAKU KOZUKA ET AL.

It is certified that error appears in the above-identified patent and that said Letters Patent is hereby corrected as shown below:

COLUMN 1

Line 46, "trasfer" should read --transfer--.
    Line 50, "a" should read --an--.

COLUMN 2

Line 13, "untrahigh-defi-" should read --ultrahigh-defi- --.
    Line 51, "iamge" should read --image--.

COLUMN 5

Line 36, "cross-secional" should read --cross-sectional--.
    Line 66, "embodiments" should read --embodiment--.

COLUMN 6

Line 9, "embodiments" should read --embodiment--.

COLUMN 7

Line 27, "layer 807" should read --layer 607--.

COLUMN 8

Line 36, "bap" should read --gap--.

UNITED STATES PATENT AND TRADEMARK OFFICE
CERTIFICATE OF CORRECTION

PATENT NO. : 5,481,124

DATED : January 2, 1996

INVENTOR(S): HIRAKU KOZUKA ET AL.

It is certified that error appears in the above-identified patent and that said Letters Patent is hereby corrected as shown below:

COLUMN 9

Line 22, "laye 609" should read --layer 609--.
Line 46, "comprises" should read --comprise--.

COLUMN 12

Line 27, "acculation," should read --accumulation,--.

COLUMN 13

Line 3, "ferece" should read --ference--.

COLUMN 14

Line 34, "oxigen," should read --oxygen,--.

COLUMN 15

Line 10, "siH$_4$" should read --SiH$_4$--.
Line 11, "a" should read --an--.
Line 21, "Although" should read --¶ Although--.
Line 28, "laye 608" should read --layer 608--.

COLUMN 16

Line 30, "abd" should read --and-- and
"is" should read --are--.

UNITED STATES PATENT AND TRADEMARK OFFICE
CERTIFICATE OF CORRECTION

PATENT NO. : 5,481,124

DATED : January 2, 1996

INVENTOR(S): HIRAKU KOZUKA ET AL.

Page 3 of 4

It is certified that error appears in the above-identified patent and that said Letters Patent is hereby corrected as shown below:

COLUMN 18

Line 46, "A still another" should read --Another--.

COLUMN 19

Line 54, "siH$_4$" should read --SiH$_4$--.
Line 55, "a" should read --an--.
Line 56, "films" should read --film,--.

COLUMN 20

Line 7, "laye" should read --layer--.

UNITED STATES PATENT AND TRADEMARK OFFICE
CERTIFICATE OF CORRECTION

PATENT NO. : 5,481,124

DATED : January 2, 1996

INVENTOR(S): HIRAKU KOZUKA ET AL.

It is certified that error appears in the above-identified patent and that said Letters Patent is hereby corrected as shown below:

COLUMN 21

Line 5, "is" should read --are--.
    Line 57, "later" should read --layer--.

Signed and Sealed this

Fourth Day of June, 1996

Attest:

BRUCE LEHMAN

Attesting Officer     Commissioner of Patents and Trademarks